United States Patent [19]
Takahashi et al.

[11] Patent Number: 5,776,812
[45] Date of Patent: *Jul. 7, 1998

[54] MANUFACTURING METHOD OF SEMICONDUCTOR DEVICE

[75] Inventors: Shigeki Takahashi, Okazaki; Mitsuhiro Kataoka, Kariya; Tsuyoshi Yamamoto, Chiryu; Yuuchi Takeuchi, Chita-gun; Norihito Tokura, Okazaki, all of Japan

[73] Assignee: Nippondenso Co., Ltd., Kariya, Japan

[*] Notice: The term of this patent shall not extend beyond the expiration date of Pat. No. 5,470,770.

[21] Appl. No.: 413,410

[22] Filed: Mar. 30, 1995

[30] Foreign Application Priority Data

| Mar. 30, 1994 | [JP] | Japan | 6-060693 |
| Mar. 31, 1994 | [JP] | Japan | 6-062448 |
| Mar. 31, 1994 | [JP] | Japan | 6-063220 |
| Sep. 9, 1994 | [JP] | Japan | 6-215769 |
| Dec. 27, 1994 | [JP] | Japan | 6-324694 |

[51] Int. Cl.$^6$ ............................................. H01L 21/336
[52] U.S. Cl. .................. 438/268; 438/270; 438/271; 438/700; 438/710
[58] Field of Search ........................... 438/268, 270, 438/271, 700, 710

[56] References Cited

U.S. PATENT DOCUMENTS

| 4,412,378 | 11/1983 | Shinada . |
| 4,735,824 | 4/1988 | Yamabe et al. . |
| 5,385,852 | 1/1995 | Oppermann . |
| 5,399,515 | 3/1995 | Davis et al. ............... 437/69 |
| 5,460,985 | 10/1995 | Tokura et al. ............ 148/DIG. 126 |
| 5,470,770 | 11/1995 | Takahashi et al. ........... 437/41 |
| 5,532,179 | 7/1996 | Chang et al. ................ 437/154 |

FOREIGN PATENT DOCUMENTS

| 0 550770 A1 | 7/1993 | European Pat. Off. . |
| 583023 | 2/1994 | European Pat. Off. . |
| 43 00 806 C1 | 12/1993 | Germany . |
| 58-93275 | 6/1983 | Japan . |
| 61-141151 | 6/1986 | Japan . |
| 61-199666 | 9/1986 | Japan . |
| 62-12167 | 1/1987 | Japan . |
| 63-250852 | 10/1988 | Japan . |
| 63-266882 | 11/1988 | Japan . |
| 286136 | 3/1990 | Japan . |
| 4-58532 | 2/1992 | Japan . |
| 4-92473 | 3/1992 | Japan . |
| 93-03502 | 2/1993 | WIPO . |

OTHER PUBLICATIONS

Nikkai Electronics, May 1986, No. 395, pp. 165–188.
M. D. Gill, "A Simple Technique for Monitoring Indercutting in Plasma Etching", Solid–State Electronics, vol. 23, No. 9, Sep. 1980, p. 995.

(List continued on next page.)

Primary Examiner—Tuan H. Nguyen
Attorney, Agent, or Firm—Cushman Darby & Cushman IP Group of Pillsbury Madison & Sutro LLP

[57] ABSTRACT

A manufacturing method of a MOSFET having a channel part on the side surface of a groove, which does not permit the introduction of defects or contaminant into the channel part and which can make the shape of the groove uniform. An $n^-$-type epitaxial layer having a low impurity concentration is formed on a main surface of an $n^+$-type semiconductor substrate. This surface is specified as a main surface, and chemical dry etching is applied to a specified region of this main surface. A region including a surface generated by the chemical dry etching is selectively oxidized to form a selective oxide film to a specified thickness. Following this process, p-type and n-type impurities are doubly diffused from the main surface to define the length of the channel and form a base layer and a source layer. Furthermore, the $n^+$-type semiconductor substrate is specified as a drain layer. After the double diffusion, a gate electrode is formed through a gate oxide film and a source electrode and a drain electrode are formed.

57 Claims, 17 Drawing Sheets

OTHER PUBLICATIONS

Lee et al., "Silicon doping effects in reactive plasma etching", *Journal of Vacuum Sciente & Technology B*, vol. 4, No. 2, Mar./Apr. 1986, pp. 468–475.

Chang et al., "Self-Aligned UMOSFET'S with a Specific On-Resistance of $1m\Omega.cm^2$", Transactions on Electron Devices, vol. ED–34, No. 11, Nov. 1987 XP000615655' pp. 2329–2334.

Ammar et al., "UMOS Transistors on (110) Silicon", IEEE Trans. on Elec. Dev., vol. ED–27, No. 5, May 1980, pp. 907–914.

Wolf et al., "Silicon Processing For the VLSI Era", vol. 1, 1986 pp. 539–583.

MANUFACTURING METHOD OF SEMICONDUCTOR DEVICE

CROSS REFERENCE TO RELATED APPLICATION

This application is based upon and claims the benefit of priority of the prior Japanese Patent applications No. 6-60693 filed on Mar. 30, 1994, No. 6-62448 filed on Mar. 31, 1994, No. 6-63220 filed on Mar. 31, 1994, No. 6-215769 filed on Sep. 9, 1994, and No. 6-324694 filed on Dec. 27, 1994, the contents of which are incorporated herein by reference.

BACKGROUND OF THE INVENTION

1. Field of the Invention

The present invention generally relates to a manufacturing method for a semiconductor device. More particularly, the present invention relates to a manufacturing method for a semiconductor device used as a power semiconductor device, i.e., a MOSFET (metal oxide semiconductor field effect transistor) and an IGBT (insulated gate bipolar transistor), and can suitably be employed for a MOSIC, etc. as a single unit or with the incorporation of a power semiconductor device.

2. Related Arts

Recently, a vertical type power MOSFET has been used in many industrial fields for various features thereof such as high frequency characteristics, fast switching speed and low power driving. The Nikkei Electronics (Nikkei-McGraw-Hills, Inc., May 19, 1986, pp. 165–188) says that the focus of the development of the power MOSFET has shifted to the low withstand voltage type and the high withstand voltage type, and that the ON-resistance of the power MOSFET having a withstand voltage of 100V or less has been lowered down to a level of 10 mΩ for the reason that channel width per unit area has been widened by using the microprocessing of LSI for the manufacture of the power MOSFET or by improving the shape of the power MOSFET. The description of this magazine centers around the prevailing vertical type power MOSFET using DMOS type (double diffusion type) cells, reasoning that the DMOS type has productional advantages of high yield and low cost owing to the use of the planar process featured by the use of a flat main surface of a silicon wafer for the channel part.

On the other hand, along with the spread of the vertical power MOSFET, there is an increasing demand for lower loss and lower cost, while the ON-resistance reduction by means of microprocessing and cell shape improvement has reached the limits. According to the Japanese Unexamined Patent Publication No. 63-266882, for example, the DMOS type has the minimal point from which the ON-resistance will not decrease however small the unit cell dimension is made by microprocessing, and it has been known that the major cause of the existence of the minimal point is an increase in the JFET (junction field effect transistor) resistance constituting a component of the ON-resistance. Furthermore, as disclosed in the Japanese Unexamined Patent Publication No. 2-86136, the unit cell dimension with which the ON-resistance takes the minimal point is approximately 15 μm under the current microprocessing technology.

Various constructions have been proposed in an attempt to break through this limit. Common to these proposals is a construction in which a groove is formed on an element surface and a channel part is formed on a side surface of the groove, and this construction can substantially reduce the above JFET resistance. Furthermore, in a construction in which the channel part is formed on the side surface of the groove, even if the unit cell dimension is reduced, the consequent increase in the JFET resistance is negligible. Therefore, there is no limit wherein the ON-resistance takes a minimal point against the reduction in the unit cell dimension unlike the description in the Japanese Unexamined Patent Publication No. 63-266882, and thus the unit cell dimension can be further reduced to the limits of current microprocessing capabilities, i.e., below 15 μm.

An example of the conventional manufacturing method with the above construction with the channel part on the side surface of the groove has been disclosed in the Japanese Unexamined Patent Publication No. 61-199666, for example, in which the groove is formed by means of RIE (reactive ion etching) and the channel part is formed on the side surface of the formed groove. Here, the RIE is a physical etching technique with a high process controllability. Specifically, in the RIE, electrodes are disposed on the top part and bottom part of a semiconductor device placed within the gas atmosphere; when a high frequency power is applied to between the electrodes, the gas is ionized into electrons and ions; and due to a large difference in the mobility of electrons and the ions between these electrodes, an cathode drop is caused to the top part of the semiconductor; this cathode drop causes an electric field, and the electric field accelerates the ions toward the semiconductor device and the ions physically collide against the surface to be etched, and the collision energy is used for etching the semiconductor device. For accelerating the ionized ions, a high frequency power is applied between the electrodes so as to cause a cathode drop of approximately 10 to 500V in absolute value. The RIE is featured by an excellent anisotropy and a consequent high resistance to side etch due to the acceleration of ionized gas in a constant direction. However, there is a problem with the RIE that, as the physically ionized gas is collided against the semiconductor device, a lattice defect is inevitably caused to the etched surface and subsequently a surface recombination occurs thereon, and as a result, the ON-resistance increases.

Some manufacturing methods have been disclosed which can control a lattice defect, for instance manufacturing methods using a wet etching technique such as in International Publication No. PCT WO93/03502 and the Japanese Unexamined Patent Publication No. 62-12167. FIGS. 25(a) and 25(b) are a plane view and cross-sectional view of a MOSFET respectively disclosed in the International Publication No. PCT WO93/03502, and FIGS. 26 through 37 are cross-sectional views of a MOSFET illustrating the manufacturing process therefor according to the same publication.

The above manufacturing process will now be briefly described.

First of all, as illustrated in FIG. 26, a wafer 21 is prepared with an n⁻-type epitaxial layer 2 developed on the main surface of a semiconductor substrate 1 made of n⁺-type silicon. This semiconductor substrate 1 has an impurity concentration of approximately $10^{20}$ cm$^{-3}$, while the n⁻type epitaxial layer 2 is developed to a thickness of approximately 7 μm and an impurity concentration of approximately $10^{16}$ cm$^{-3}$. A field oxide film 60 is formed to a thickness of approximately 60 nm by thermally oxidizing the main surface of the wafer 21, and then a resist film 61 is deposited and patterned by the publicly known photolithographic technique with the central part thereof open, the location of which being coincided with a location of cell formation. Then, boron ions (B⁺) are implanted through the field oxide film 60 by using the resist film 61 as a mask.

After removing the resist film 61, as illustrated in FIG. 27, a p-type diffusion layer 62 is formed to a junction depth of approximately 3 μm. The p-type diffusion layer 62 ultimately becomes a part of a p-type base layer 16 (described herein later), and plays a role of improving the surge resistance by stably causing breakdown to the bottom part of the p-type diffusion layer 62 when a high voltage is applied to between a drain electrode and a source electrode.

Next, as illustrated in FIG. 27, a silicon nitride film 63 is deposited to a thickness of approximately 200 nm on the main surface of the wafer 21. The silicon nitride film 63 is patterned into a lattice-like open pattern with openings with a pitch (dimension of a unit cell 15) a. Incidentally, mask alignment is applied to the open pattern so that the p-type diffusion layer 62 can be positioned in the central part of the pitch.

Following the above, as illustrated in FIG. 28, the field oxide film 60 is etched by using the silicon nitride film 63 as a mask, and then a groove 64 is formed by etching the n$^-$-type epitaxial layer 2 to a depth of approximately 1.5 μm.

As illustrated in FIG. 29, this time, the groove 64 is thermally oxidized by using the silicon nitride film 63 as a mask, which is a well known oxidizing technique as LOCOS (local oxidation of silicon). By this oxidation, a selective oxide film, i.e., a LOCOS oxide film 65 is formed, and concurrently a U-groove 50 is formed on the surface of the n$^-$-type epitaxial layer 2 eroded by the LOCOS oxide film 65 and the shape of the groove 50 is fixed.

Then, as illustrated in FIG. 30, boron ions are implanted through a thin field oxide film 60 by using the LOCOS oxide film 65 as a mask to form the p-type base layer 16. In this process, the boundary surface between the LOCOS oxide film 65 and the field oxide film 60 is coincided with a self-alignment position, and accordingly a region into which boron ions are to be implanted can be defined exactly.

In the next process, as illustrated in FIG. 31, thermal diffusion is performed to obtain a junction depth of approximately 3 μm. By this thermal diffusion, the p-type diffusion layer 62 previously formed in the process illustrated in FIG. 27 and the diffusion layer of the boron ions implanted in the process illustrated in FIG. 30 are integrated into the single p-type base layer 16, and both end surfaces of the p-type base layer 16 are self-alignedly defined in the position of the side walls of the U-groove 50.

Now, as illustrated in FIG. 32, phosphorous ions are implanted through the thin field oxide film 60 by using both a resist film 66 patterned by a pattern left on the central part of the surface of the p-type base layer 16 surrounded by the LOCOS oxide film 65 formed on the surface of the wafer 21 by a lattice-like pattern and the LOCOS oxide film 65 to form the n$^+$-type source layer 4. In this process as well, like the ion implantation performed with boron ions in the process illustrated in FIG. 30, the boundary part between the LOCOS oxide film 65 and the field oxide film 60 is coincided with a self-alignment position, and accordingly a region into which phosphorous ions are to be implanted can be defined exactly.

After the above, as illustrated in FIG. 33, the n$^+$-type source layer 4 is formed and concurrently the channel 5 is set up by thermal diffusion to a junction depth of 0.5 to 1 μm. By this thermal diffusion, the end surface being in contact with the U-groove 50 in the region of the n$^+$-type source layer 4 is self-alignedly defined.

As a result of the processes illustrated in FIGS. 30 through 33, the junction depth and shape of the p-type base layer 16 can be fixed.

As illustrated in FIG. 34, now, the LOCOS oxide film 65 is removed by wet etching to expose an inside wall 51 of the U-groove 50, and then a gate oxide film 8 is formed to a thickness of approximately 60 nm by thermal oxidation.

Next, as illustrated in FIG. 35, a polysilicon film is deposited to a thickness of approximately 400 nm on the main surface of the wafer 21.

Following the above, as illustrated in FIG. 36, boron ions are implanted through the oxide film 67 by using the patterned resist film 68 as a mask in preparation for forming a p$^+$-type base contact layer 17.

Then, as illustrated in FIG. 37, the p$^+$-type base contact layer 17 is formed by the thermal diffusion to a junction depth of approximately 0.5 μm.

Subsequently, as illustrated in FIG. 25(b), an interlayer insulating film 18 is formed with BPSG (boron phosphate silicate glass) on the main surface of the wafer 21, and contact holes are made in parts of the interlayer insulating film 18 to expose the p$^+$-type base contact layer 17 and the n$^+$-type source layer 4. Furthermore, a source electrode 19 is formed with an aluminum film to achieve an ohmic contact between the source electrode 19 and the p$^+$-type base contact layer 17 and n$^+$-type source layer 4 through the contact holes. In addition, a passivation film (not illustrated) for protecting the aluminum film is formed by the plasma CVD method or the like using silicon nitride. On the other hand, on the back surface of the wafer 21 is formed a drain electrode 20 with three layers of a Ti film, a Ni film and a Au film and ohmically contacted with the n$^+$-type semiconductor substrate 1.

However, according to the manufacturing methods disclosed in the above International Publication No. PCT WO93/03502 and the Japanese Unexamined Patent Publication No. 62-12167, there is a problem that as the wet etching technique which is isotropic etching technique is used, an excessive etching over a specified etching width (i.e., side etch) is caused, a uniform groove with a constant depth can not be formed on the wafer surface due to uneven etching liquid, and consequently the process controllability is low.

Another problem is that, as the groove shape within the wafer surface is not uniform, the unevenness in the electric characteristics of the FET is large. The cause of the uneven groove shape is presumed to be the unevenness in the groove shape within the wafer surface in the etching process prior to the LOCOS oxidation. It may be an idea to form the channel groove by the LOCOS oxidation alone. However, this would lengthen the LOCOS oxidation time period and the angle of the groove side surface would be as gentle as approximately 30°, and this would make it impossible to micronize cells and the reduction in the ON-resistance would not be promising. Furthermore, if the channel groove is formed by the LOCOS oxidation alone, as the volume of Si almost doubles due to oxidation by nature, the channel part might be strained by the increase in the Si volume. Therefore, the etching process prior to the LOCOS oxidation, i.e., the initial groove formation process, is necessary by all means.

From the above viewpoint, in order to manufacture a vertical type MOSFET at a low voltage with uniformity in the electric characteristics within the wafer surface being maintained, it is necessary to perform the LOCOS oxidation without introducing any defect or contaminant into the channel part after the formation of the initial groove and besides remove the LOCOS oxide film to make the groove shape uniform within the wafer surface.

However, the manufacturing methods disclosed in the above publications have a problem that reducing the channel defect and exactly controlling the channel groove shape together is impossible.

SUMMARY OF THE INVENTION

In view of the above problems, it is a primary object of the present invention to obtain a manufacturing method for a MOSFET having a channel part on the side surface which can reduce the channel part defect and exactly control the groove shape.

The manufacturing method according to the present invention aiming to achieve the above object comprises: a mask formation process for forming a mask having an opening part within a specified region on the main surface of a first conductivity type semiconductor layer disposed on a semiconductor substrate; a chemical dry etching process for forming a first groove having an inlet part wider than an opening part of the mask, a bottom surface roughly parallel to the main surface and a side surface connecting the inlet part and the bottom part by applying a chemical dry etching to the semiconductor layer through the opening of the mask; an oxidation process for forming an oxide film to a specified thickness on the surface of the first groove by oxidizing a region including the first groove; an impurity introduction process for forming a second conductivity type base layer within the semiconductor layer by introducing second conductivity type impurities from the main surface so as to include the surface of the semiconductor layer being adjacent to the oxide film, forming a first conductivity type source layer within the base layer by introducing first conductivity type impurities from the main surface, and forming a channel region on the side wall of the base layer concurrently with the formation of the source layer; an oxide film removal process for forming a second groove having a specified depth deeper than the first groove by removing the oxide film; and an electrode formation process for forming a gate electrode on the surface of the second groove between the source layer and the semiconductor layer through a gate insulating film, forming a source electrode which is to electrically contact the source layer and the base layer, and forming a drain electrode which is to electrically contact the semiconductor substrate.

Incidentally, the chemical dry etching process may preferably be an isotropic etching process, and if a gas system including carbon tetrafluoride and oxygen is used for etching, high reproducibility can be achieved by controlling the ratio of the carbon tetrafluoride to the oxygen.

In addition, the chemical dry etching process may be an etching process using a gas system which includes one or more than one of $CCl_4$, $Cl_2$, $SF_6$, $CFCl_3$, $CF_2Cl_2$, $CF_3Cl$, $CHF_3$, $C_2ClF_5$, $F_2$, $NF_3$ and $BCl_3$, and the efficiency of this etching process is high.

Furthermore, the chemical etching may preferably be performed within the ionized gas atmosphere with substantially no cathode drop (self bias) at the upper part of the semiconductor layer, and if any, the cathode drop at the upper part of the semiconductor layer may preferably be less than 10V in absolute value.

Moreover, the oxidation process according to the present invention may preferably comprise a selective oxidation process for forming a selective oxide film to a specified thickness on the surface of the first groove and between the mask and the semiconductor substrate by selectively oxidizing a region including the first groove; the impurity introduction process may preferably comprise a process for forming the base layer of the second conductivity type by introducing the second conductivity type impurities from the side of the main surface so as to include the surface of the semiconductor layer being adjacent to the selective oxide film and a process for forming the source layer of the first conductivity type by introducing the first conductivity type impurities from the side of the main surface into the base layer; and the oxide film removal process may preferably comprise a selective oxide film removal process for forming the second groove having a specified depth deeper than the first groove by removing the selective oxide film.

Here, the selective oxide process may use the mask formed in the mask forming process for selective oxidation. Therefore, there is no need to form a new mask or to perform mask alignment.

Also, the oxide film removal process according to the present invention may preferably be a process for forming a second groove by removing the oxide film while the surface of the oxide film is terminated with hydrogen within an aqueous solution, and then forming an oxide film for protecting the second groove by oxidizing the surface of the second groove applied with the termination with hydrogen within gas including oxygen. Here, the oxide film removal process is featured by the removal of the oxide film by terminating with hydrogen a dangling bond generated on the surface of the oxide film within an aqueous solution including hydrofluoric acid. As a result of this process, the highly reactive dangling bond reacts to the hydrogen before reacting to the contaminant into a stable state, whereby the reaction of the contaminant to the semiconductor layer can be prevented. Subsequently, when the dangling bond is exposed to the oxygen, a more stable oxide film can be formed, whereby the surface of the second groove can be protected and the following contamination of the channel region can be prevented. In short, a high channel mobility can be obtained, and a low ON-state voltage can be realized.

Furthermore, the oxide film removal process according to the present invention is featured by a process in which the oxide film is removed with at least the surface of the oxide film being shaded from light. Therefore, there is no light irradiated onto the semiconductor layer to be a channel region. Accordingly, the electric potential of the source layer is almost equal to the electric potential of the base layer both in the neighborhood of the channel region, the development of etching from a limited part can be prevented, and a uniform etching is possible. As a result, a flat channel region can be obtained, and a high mobility can be realized.

According to the present invention constructed as described above, a specified region of the surface of the semiconductor layer having a low impurity concentration is removed by the chemical dry etching method prior to the selective oxidation. The chemical dry etching method which is one of the dry etching methods is high in process controllability, uniform in etching within the wafer surface, and high in reproducibility. The chemical dry etching gives comparatively less damage to the etching surface compared with other dry etching methods. After this chemical dry etching, the surface of the first groove is oxidized. In this oxidation process, according to the surface condition of the first groove from which the oxidation is started, the condition of the boundary surface with the oxide film of the resultant semiconductor layer varies. That is, even if the surface etched by a physical etching technique such as RIE is oxidized, the oxidation advances without removing lattice defects, and the lattice defects remain on the surface of the resultant semiconductor layer. However, in the present invention, by applying the chemical dry etching to the surface of the first groove, the first groove with a few lattice defects can be formed, and oxidation of the surface of the resultant first groove can be uniform from the start of the oxidation, and therefore the surface of the second groove can have a few lattice defects. Furthermore, as the surface of this second groove is used for the channel region, a low ON-resistance can be obtained. Moreover, as two processes of the chemical dry etching and the oxidation are applied to the formation of the second groove for the channel region, when the second groove is desired to be formed to a specified width, only what is required is to control the width to be oxidized. Therefore, the shape of the second groove can exactly be controlled.

Here, if the chemical dry etching process is isotropic, the first groove has no corner part, and consequently the second groove formed by oxidation has no corner part, whereby the withstand voltage between the drain layer and the source layer can be improved.

In addition to the above, if there is no substantial cathode drop (less than 10V in absolute value) during the chemical dry etching process, there is no possibility that the ionized gas collides against the surface of the semiconductor layer at such a speed that the collision gives defects to the surface of the semiconductor. Accordingly, the surface of the formed first groove has a few defects.

Furthermore, by removing the oxide film within an aqueous solution including hydrofluoric acid, the selection ratio of the oxide film to be removed and the semiconductor layer not to be removed can be set to be a very large, and the oxide film can be removed without damaging the surface of the semiconductor layer.

Still furthermore, if the index of plane of the side surface of the second groove formed by removing the selective oxide film is (110) or (100), the side surface can be flat in terms of atomic order of silicon, whereby a high channel mobility can be obtained.

On the other hand, if the index of plane of the side surface of the second groove formed by removing the selective oxide film is (111), the silicon atoms of the side surface of the second groove is terminated with a single piece of hydrogen, and the side surface can be flat in terms of atomic order, whereby a high channel mobility can be obtained. Here, if the oxide film removal process is performed within an aqueous solution of pH4 or more, the possibility of terminating the silicon atoms of the side surface of the second groove with a single piece of hydrogen becomes higher, and the (111) surface flat in terms of atomic order can be obtained, whereby a high channel mobility can be obtained.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

An embodiment according to the present invention will now be described with reference to the appended drawings.

Figure 1A:
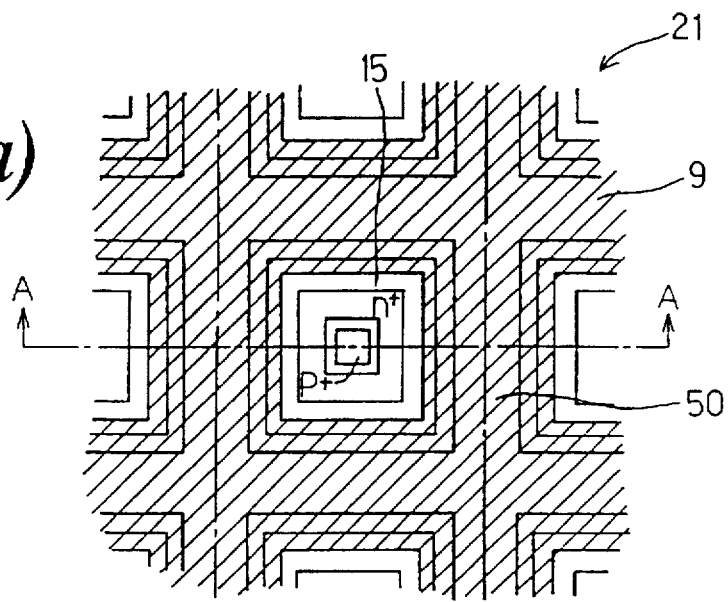
FIG. 1(a) is a plane view illustrating a part of the vertical type power MOSFET of the first embodiment according to the present invention.
Figure 1B:
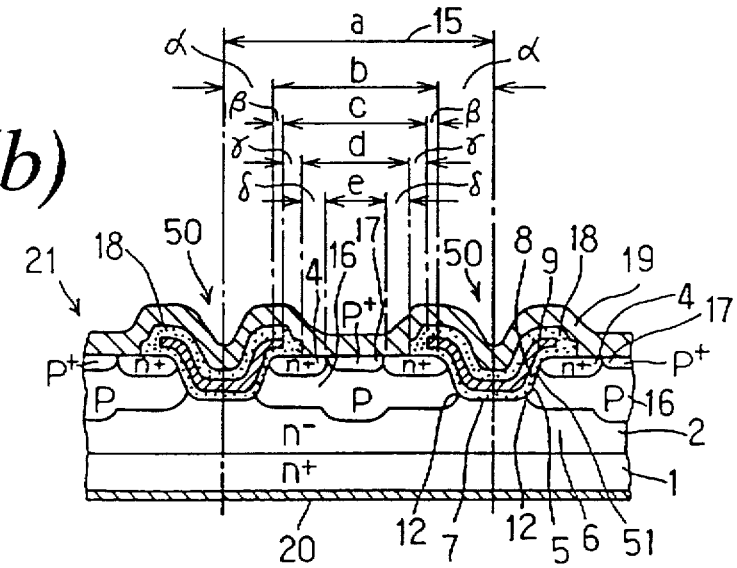
FIG. 1(b) is a cross-sectional view taken along line A—A of FIG. 1(a)
Figure 4:
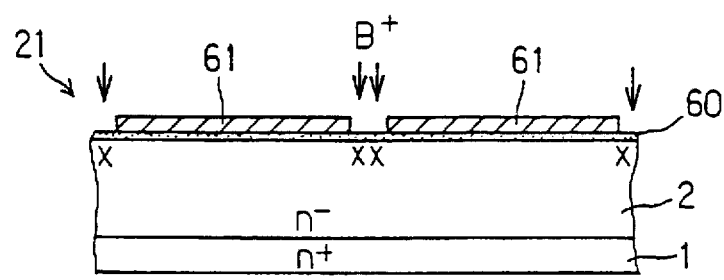
FIG. 4 is a cross-sectional view illustrating the manufacturing process of the important part of the vertical type power MOSFET of the first embodiment according to the present invention.
Figure 5:
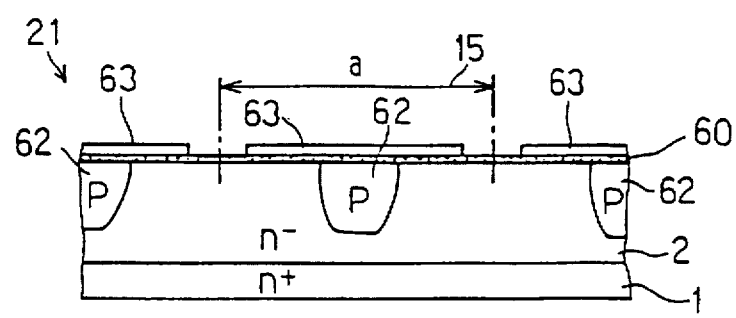
FIG. 5 is a cross-sectional view illustrating the manufacturing process of the important part of the vertical type power MOSFET of the first embodiment according to the present invention.
Figure 7:
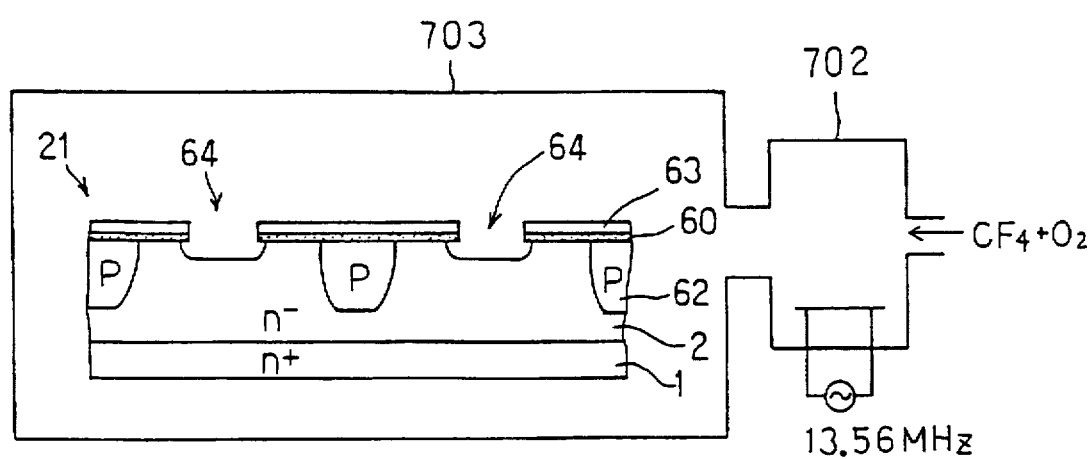
FIG. 7 is a view illustrating the manufacturing process of the vertical type power MOSFET of the first embodiment according to the present invention.
Figure 8:
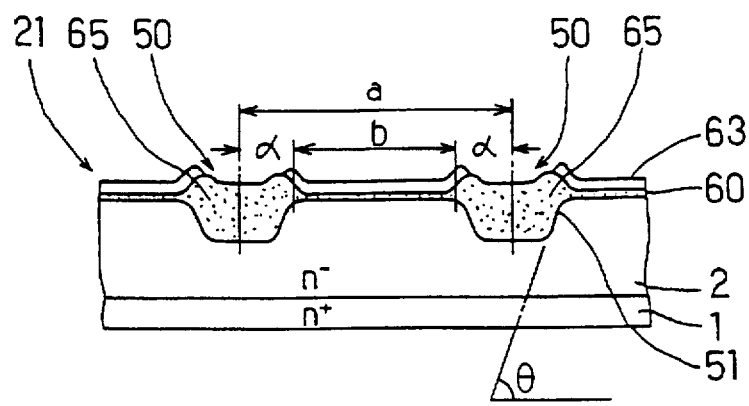
FIG. 8 is a cross-sectional view illustrating the manufacturing process of the important part of the vertical type power MOSFET of the first embodiment according to the present invention.
Figure 9:
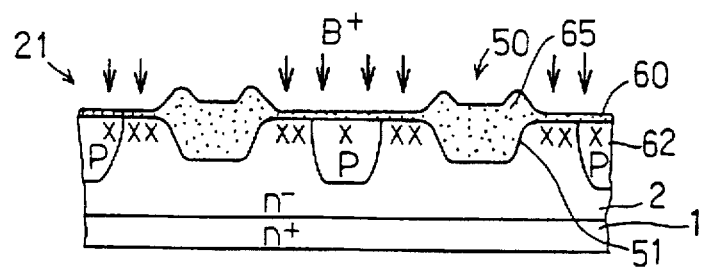
FIG. 9 is a cross-sectional view illustrating the manufacturing process of the important part of the vertical type power MOSFET of the first embodiment according to the present invention.
Figure 10:
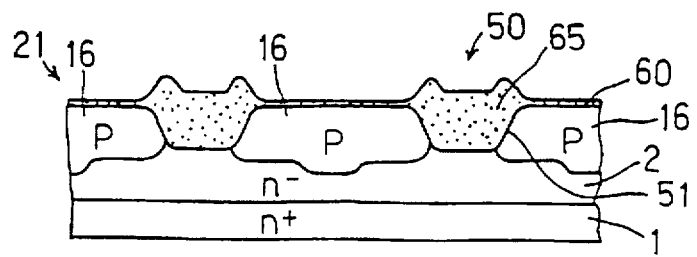
FIG. 10 is a cross-sectional view illustrating the manufacturing process of the important part of the vertical type power MOSFET of the first embodiment according to the present invention.
Figure 11:
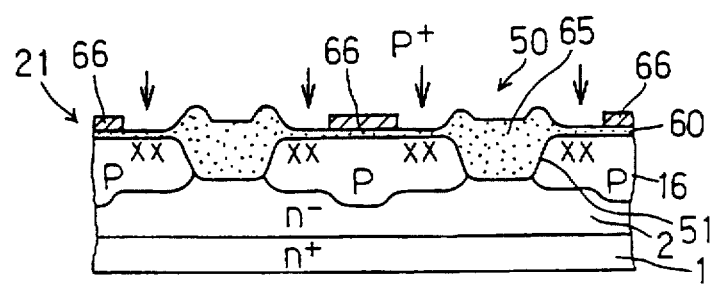
FIG. 11 is a cross-sectional view illustrating the manufacturing process of the important part of the vertical type power MOSFET of the first embodiment according to the present invention.
Figure 18:
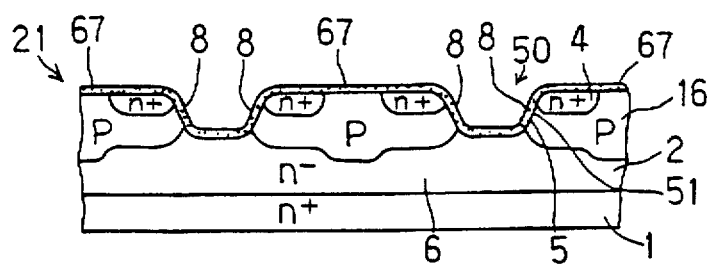
FIG. 18 is a cross-sectional view illustrating the manufacturing process of the important part of the vertical type power MOSFET of the first embodiment according to the present invention.
Figure 19:
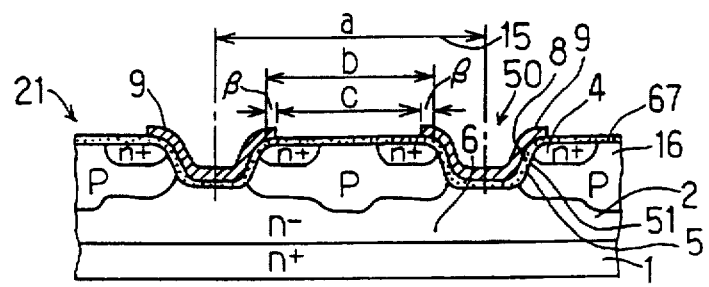
FIG. 19 is a cross-sectional view illustrating the manufacturing process of the important part of the vertical type power MOSFET of the first embodiment according to the present invention.
Figure 21:
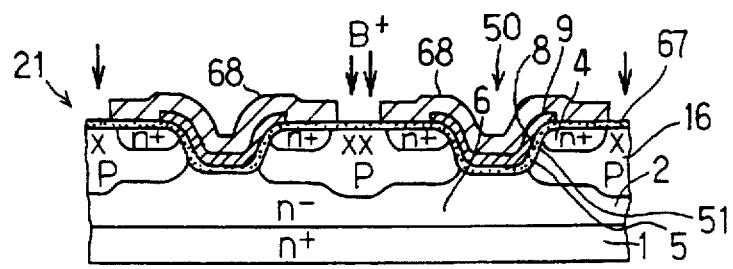
FIG. 21 is a cross-sectional view illustrating the manufacturing process of the important part of the vertical type power MOSFET of the first embodiment according to the present invention.
Figure 22:
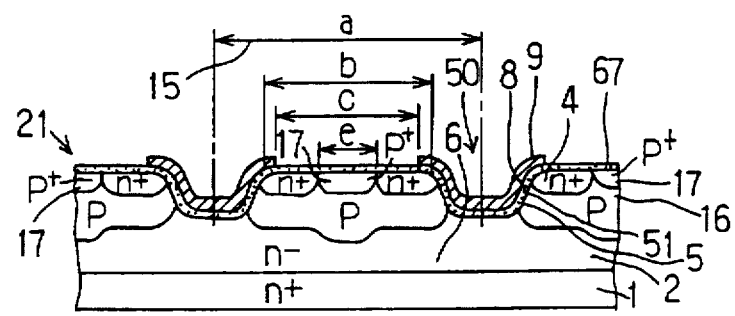
FIG. 22 is a cross-sectional view illustrating the manufacturing process of the important part of the vertical type power MOSFET of the first embodiment according to the present invention.
Figure 20:
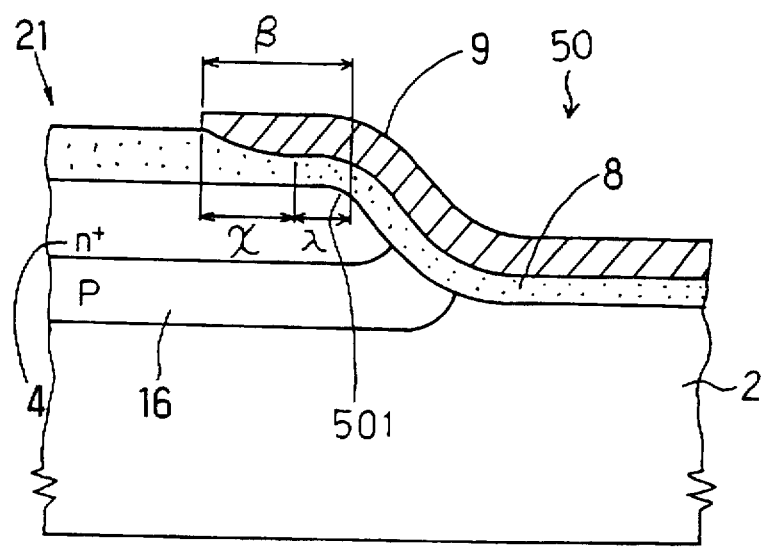
FIG. 20 is a cross-sectional view illustrating the manufacturing process of the important part of the vertical type power MOSFET of the first embodiment according to the present invention.

FIG. 1(a) is a plan view of a vertical type power MOSFET composed of a numerosity of square unit cells according to the first embodiment of the present invention, and FIG. 1(b) is a cross-sectional view taken along line A—A of FIG. 1(a). FIGS. 2 through 22 are descriptive views of the respective stages of the manufacturing method for a vertical type power MOSFET according to the first embodiment, wherein FIG. 4 is a cross-sectional view of a wafer into which boron ions have been implanted to form a central part of a p-type base layer; FIG. 5 is a cross-sectional view of the wafer whose silicon nitride film has been patterned at a pitch which is equal to the dimension of a unit cell a for the LOCOS (localized oxidation of silicon); FIG. 8 is a cross-sectional view of the wafer on which the LOCOS oxide film has been formed; FIG. 9 is a cross-sectional view of the wafer into which boron ions have been implanted to form a p-type base layer by using the LOCOS oxide film as a mask; FIG. 10 is a cross-sectional view of the wafer on which a p-type base layer has been formed by means of thermal diffusion; FIG. 11 is a cross-sectional view of the wafer into which phosphorous ions have been implanted to form an n$^+$-type source layer by using the LOCOS oxide film as a mask; FIG. 18 is a cross-sectional view of the wafer on which the n$^+$-type source layer has been formed by means of thermal diffusion; FIG. 20 is a cross-sectional view of the wafer on which a gate oxide film has been formed by means of thermal oxidation since the removal of the LOCOS oxide film; FIG. 19 is a cross-sectional view of the wafer with a gate electrode formed on the gate oxide film; FIG. 21 is a cross-sectional view of the wafer into which boron ions have been implanted to form a p$^+$-type base contact layer; FIG. 22 is a cross-sectional view of the wafer on which the p$^+$-type base contact layer has been formed by means of thermal diffusion; and FIG. 1(b) is the cross-sectional view of the completed wafer on which an interlayer insulating film, a source electrode and a drain electrode have been formed.

The main part (unit cell part) of the vertical type power MOSFET according to this embodiment is so constructed as illustrated in FIGS. 1(a) and 1(b) in which a numerosity of unit cells 15 are laid out lengthwise and breadthwise with ordination at a pitch (unit cell dimension) of a.

In FIGS. 1(a) and 1(b), a wafer 21 is composed of a semiconductor substrate 1 comprising an n$^+$-type silicon having an impurity density of $10^{20}$ cm$^{-3}$ and a thickness of 100 to 300 µm, an n$^-$-type epitaxial layer 2 having an impurity density of approximately $10^{16}$ cm$^{-3}$ and a thickness of approximately 7 µm formed on the semiconductor substrate 1 and a unit cell 15 formed on the main surface of the wafer 21. On the main surface of the wafer 21 is formed a LOCOS oxide film to a thickness of approximately 3 µm to form a U-groove 50 at a pitch of the unit cell dimension a (=approximately 12 µm) and by using this oxide film are formed a p-type base layer 16 to a junction depth of approximately 3 µm and an n$^+$-type source layer 4 to a junction depth of approximately 1 µm, whereby a channel 5 is set on the side wall part 51 of the U-groove 50. Incidentally, the p-type base layer 16 is set to a junction depth which does not permit the p-type layer 16 to be fractured due to breakdown at an edge part 12 on the bottom of the U-groove 50. Furthermore, boron ions have been implanted into the central part of the p-type base layer 16 beforehand to deepen the junction depth in the central part of the p-type layer 16 down from the circumference, so that a breakdown can be caused when a high voltage is applied to between the drain electrode and the source electrode. After the double diffusion, the diffusion mask and the LOCOS oxide film used for forming the U-groove 50 are removed, a gate oxide film 8 is formed to a thickness of approximately 60 nm on the inner wall of the U-groove 50 and on the gate oxide film 8 are formed a gate electrode 9 with a polysilicon to a thickness of approximately 400 nm and an interlayer insulating film 18 with a BPSG to a thickness of approximately 1 μm. Furthermore, a p$^+$-type base contact layer 17 is formed to a junction depth of approximately 0.5 μm in the central part surface of the p-type base layer 16 and ohmic contact is made between a source electrode 19 formed on the interlayer insulating film 18 and the n$^+$-type source layer 4 and p$^+$-type base contact layer 17 through contact holes. On the other hand, a drain electrode 20 is formed on the back surface of the semiconductor substrate 1 to make ohmic contact therewith.

An example of the manufacturing method according to this embodiment will now be described.

Figure 2:
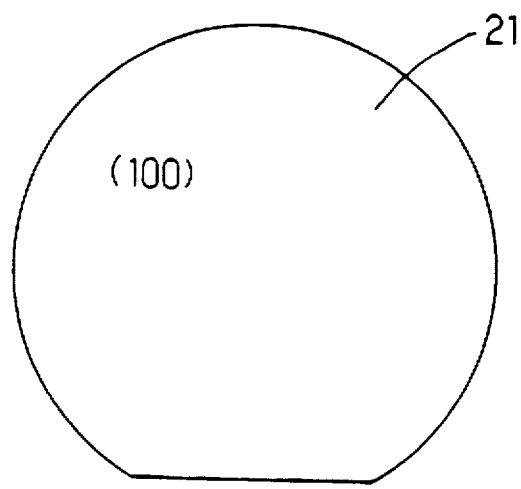
FIG. 2 is a view illustrating the manufacturing process of the vertical type power MOSFET of the first embodiment according to the present invention.
Figure 3:
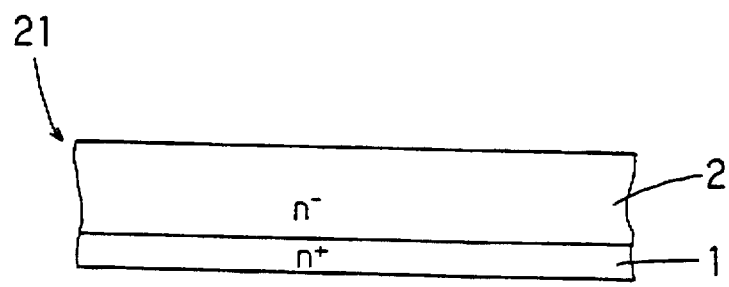
FIG. 3 is a cross-sectional view illustrating the manufacturing process of an important part of the vertical type power MOSFET of the first embodiment according to the present invention.

A wafer 21 is prepared in which, as illustrated in FIGS. 2 and 3, an n$^-$-type epitaxial layer 2 is formed by means of epitaxial growth on the main surface of the semiconductor substrate 1 having the index of plane of (100). The impurity concentration of this semiconductor substrate 1 (equivalent to a semiconductor substrate) is approximately $10^{20}$ cm$^{-3}$ and the thickness of the epitaxial layer 2 (equivalent to a semiconductor layer) is approximately 7 μm and the impurity concentration thereof is approximately $10^{16}$ cm$^{-3}$. Then, as illustrate in FIG. 4, a field oxide film 60 is formed to a thickness of approximately 60 nm by thermally oxidizing the main surface of the wafer 21 and subsequently a resist film 61 is deposited on the field oxide film 60 and the resist film is patterned to form a pattern opened in the central part of a region where a cell is to be formed by means of the publicly known photolithographic technique. Then, boron (B$^+$) ions are implanted into the field oxide film 60 by using the resist film 61 as a mask.

As illustrated in FIG. 5, after removing the resist, a p-type diffusion layer 62 is formed to a junction depth of approximately 3 μm by means of thermal diffusion. This p-type diffusion layer 62 ultimately constitutes a part of the p-type base layer 16 (described herein later) and plays a role of improving the surge resistance of the device by stably causing a breakdown at the bottom part of the p-type diffusion area when a high voltage is applied to between the drain electrode and the source electrode.

Figure 6:
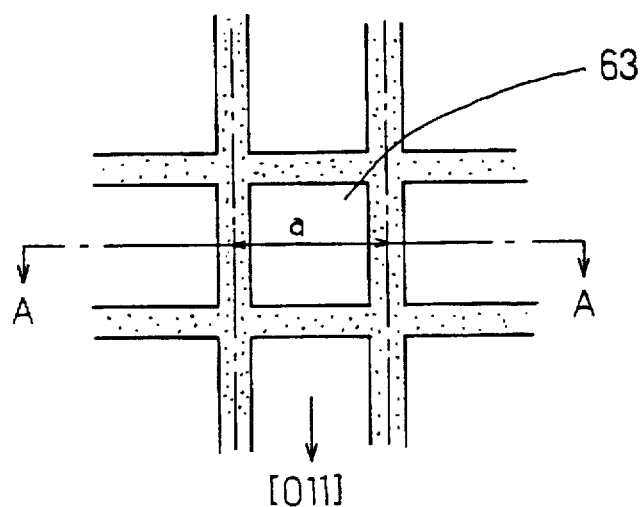
FIG. 6 is a plane view illustrating the manufacturing process of the important part of the vertical type power MOSFET of the first embodiment according to the present invention.

Furthermore, as illustrated in FIG. 5, a silicon nitride film 63 is deposited to a thickness of approximately 200 nm on the main surface of the wafer 21. Then, as illustrated in FIG. 6, the silicon nitride film 63 (equivalent to a mask) is patterned to be vertical and parallel to an orientation of <011> to form a lattice-like open pattern opening at a pitch of a (dimension of unit cell 15) (equivalent to a mask formation process). This open pattern is mask-aligned so that the above p-type diffusion layer 62 can be positioned in the central part of the pitch.

The field oxide film 60 is etched by using the silicon nitride film 63 as a mask. Following this, as illustrated in FIG. 7, a chemically active species is made by generating plasma within a discharge chamber 702 containing a carbon tetrafluoride and oxygen gas and the active species is transported into a reaction chamber 703 and a groove 64 is formed by isogonally applying chemical dry etching to the n$^-$-type epitaxial layer 2 within the reaction chamber 703 (equivalent to a chemical dry etching process).

Next, as illustrated in FIG. 8, the part of the groove 64 is thermally oxidized by using the silicon nitride film 63 (equivalent to an oxidation process and a selective oxidation process). This is an oxidation method well known as the LOCOS (local oxidation of silicon) method. By this oxidation, a LOCOS oxide film 65 (equivalent to an oxide film and a selective oxide film) is formed and concurrently a U-groove 50 (equivalent to a second groove) is formed on the surface of the n$^-$-type epitaxial layer 2 eroded by the LOCOS oxide film 65 and the shape of the U-groove is fixed.

In the above process, the conditions of the chemical dry etching and LOCOS oxidation are selected by controlling an angle θ of the side surface of the U-groove to the surface of the semiconductor substrate 1 (FIG. 8) so that the index of plane of the channel forming part on the side surface of the U-groove 50 can be approximates to (111).

The inside wall surface 51 of the U-groove 50 formed by the LOCOS oxidation as described above has a high flatness and a few defects and the surface condition thereof is as good as the main surface of the wafer 21 in the initial stage illustrated in FIG. 2.

Now, as illustrated in FIG. 9, boron ions are implanted through the thin field oxide film 60 by using the LOCOS oxide film 65 as a mask to form the p-type base layer 16. As a result, the boundary part between the LOCOS oxide film 65 and the field oxide film 60 constitutes a self-alignment position to exactly define a region into which boron ions are implanted.

Then, as illustrated in FIG. 10, thermal diffusion is applied to the field oxide film 60 to a junction depth of approximately 3 μm. As the result of this thermal diffusion, the p-type diffusion layer 62 previously formed in the process illustrated in FIG. 5 and the boron diffusion region into which boron ions have been implanted in the process illustrated in FIG. 9 are integrated into the p-type base layer 16 (equivalent to a base layer), both ends of which are self-aligned and defined by the positions of the side walls of the U-groove 50.

Subsequently, as illustrated in FIG. 11, phosphorous ions are implanted through the thin field oxide film 60 by using a resist film 66 patterned according to the pattern left on the central part of the surface of the p-type base layer 16 surrounded by the LOCOS oxide film 65 formed on the surface of the wafer 21 according to the lattice-like pattern and the LOCOS oxide film 65 as masks to form the n$^+$-type source layer 4 (equivalent to a source layer). In this process, like the process illustrated in FIG. 9 in which boron ions have been implanted, the boundary part between the LOCOS oxide film 65 and the field oxide film 60 constitutes a self-alignment position, whereby the ion implantation region can exactly be defined.

Figure 12:
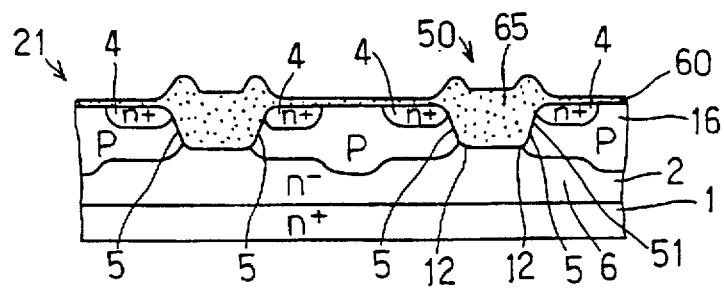
FIG. 12 is a cross-sectional view illustrating the manufacturing process of the important part of the vertical type power MOSFET of the first embodiment according to the present invention.

The next process is, as illustrated in FIG. 12, to apply thermal diffusion to a junction depth of 0.5 to 1 μm to form the n$^+$-type source layer 4 and set the channel 5 (equivalent to a channel region) as well. The end surface being in contact with the U-groove 50 in the region of the n$^+$-type source layer 4 is self-aligned and defined in the position of the side wall of the U-groove 50 (equivalent to an impurity introduction process).

The processes illustrated in FIGS. 9 to 12 fix the junction depth and shape of the n-type base layer 16. Here, a point is that the shape of the p-type base layer 16 is perfectly symmetric with respect to the U-groove 50 due to the self-alignment and thermal diffusion.

Figure 13:
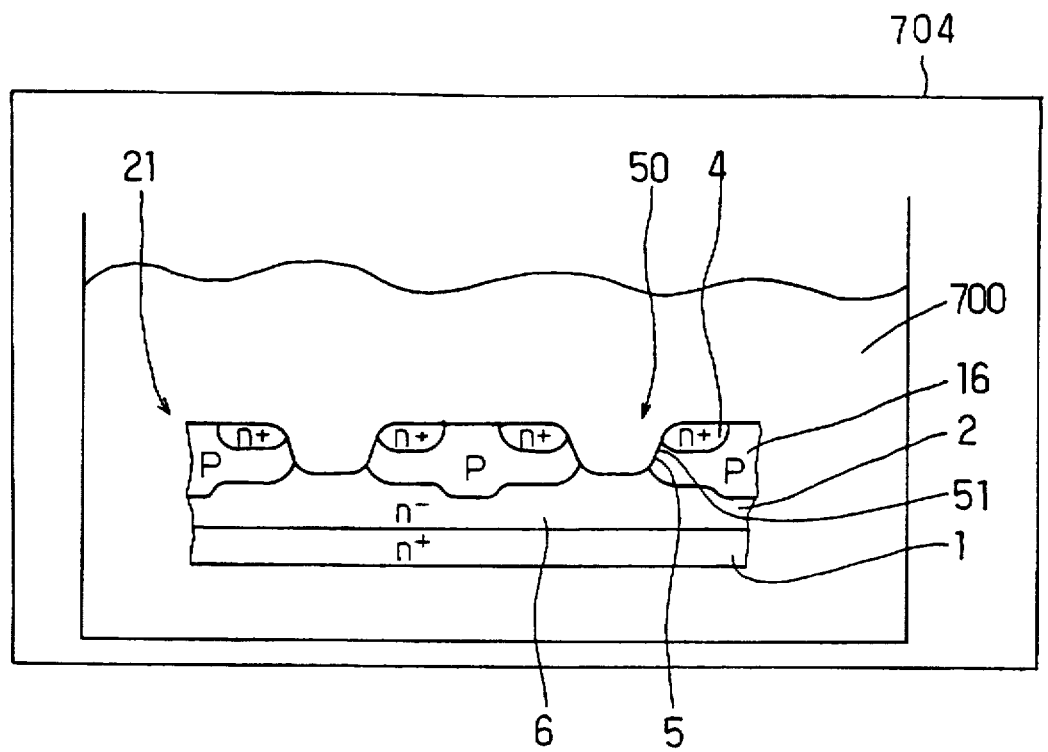
FIG. 13 is a view illustrating the manufacturing process of the vertical type power MOSFET of the first embodiment according to the present invention.

Next, as illustrated in FIG. 13, an inside wall 51 of the U-groove 50 is exposed by removing the LOCOS oxide film 65 by way of terminating the silicon surface with hydrogen within an aqueous solution containing hydrofluoric acid and adjusted to an acidity/alkalinity of around pH5 with ammonium fluoride. This process may be performed by applying an shading cloth 704 over the wafer 21 to shade the surface with the selective oxide film from light (equivalent to an oxide film removal process and a selective oxide film removal process).

After the completion of the above process, the wafer 1 is taken out of the aqueous solution and dries in a clean air.

Figure 14:
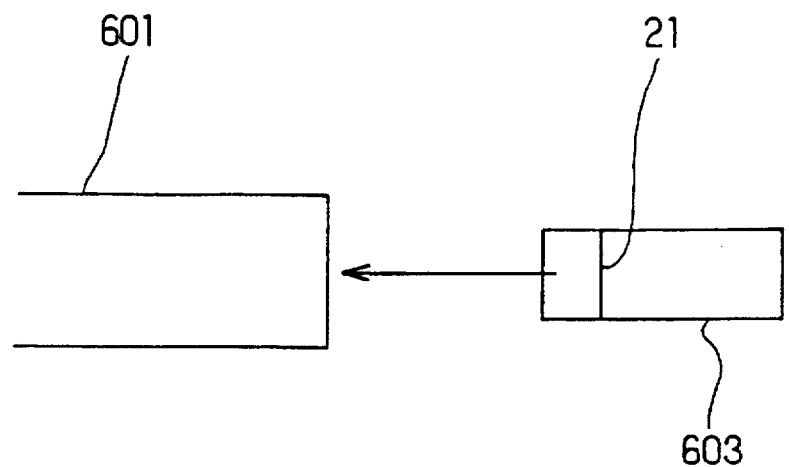
FIG. 14 is a view illustrating the manufacturing process of the vertical type power MOSFET of the first embodiment according to the present invention.
Figure 15:
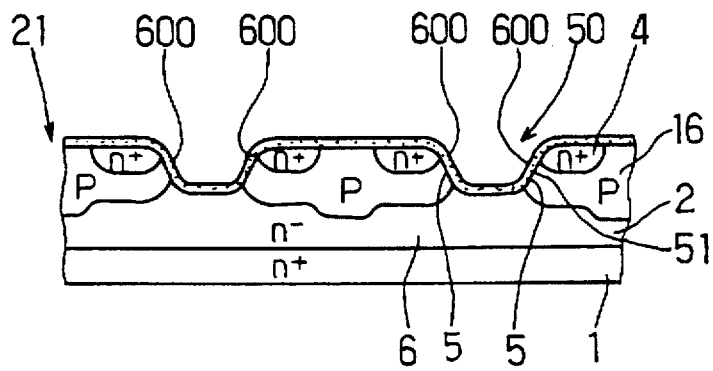
FIG. 15 is a cross-sectional view illustrating the manufacturing process of the important part of the vertical type power MOSFET of the first embodiment according to the present invention.
Figure 16:
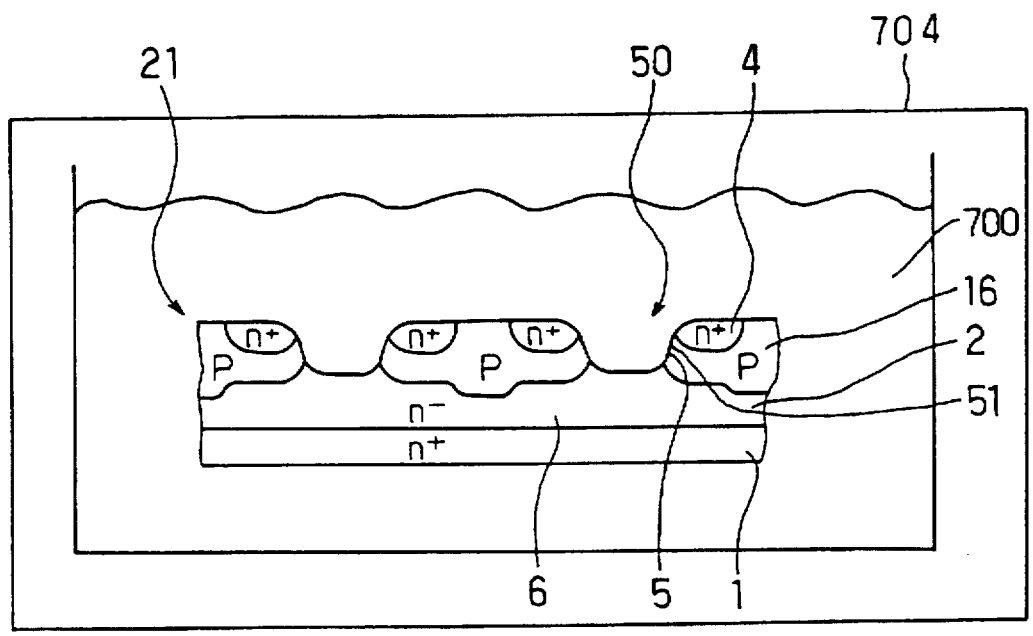
FIG. 16 is a view illustrating the manufacturing process of the vertical type power MOSFET of the first embodiment according to the present invention.
Figure 17:
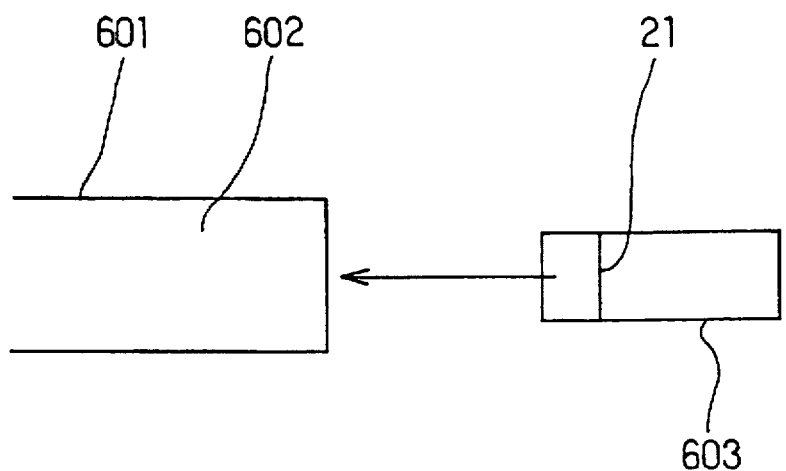
FIG. 17 is a view illustrating the manufacturing process of the vertical type power MOSFET of the first embodiment according to the present invention.

Then, as illustrated in FIG. 15, an oxide film is formed on a side surface of the U-groove 50 of the p-type base layer 16 on which the channel 5 is to be formed until the (111) plane is formed. By this thermal oxidation process, the flatness of the surface on which the channel 5 is to be formed is improved in terms of atomic order. As illustrated in FIG. 14, this thermal oxidation process is performed by slowly inserting the wafer 21 into an oxidation furnace 601 which is maintained within the oxygen atmosphere at a temperature of approximately 1000° C. In this thermal oxidation process, as the initial stage of the oxidation is performed at a comparatively low temperature, the scattering of impurities within the p-type base layer region 16 and $n^+$-type source region 4 to the outside of the wafer 21 during the thermal oxidation process can be controlled. Then, an oxide film 600 thus formed is removed as illustrated in FIG. 16. The removal of the oxide film 600 is also performed by way of terminating the exposed silicon surface with hydrogen within an aqueous solution containing hydrofluoric acid and adjusted to an acidity/alkalinity of around pH5 with ammonium fluoride. The inside wall surface 51 of the U-groove 50 formed by this method is a good silicon surface with a high flatness and a few defects.

As illustrated in FIG. 18 this time, a gate oxide film 8 is formed to a thickness of approximately 60 nm on the side surface and bottom surface of the U-groove 50 by thermal oxidation. This thermal oxidation process is, as described above and as illustrated in FIG. 17, performed by slowly lowering the wafer 21 into an oxidation furnace 601 which is maintained within the oxygen atmosphere at a temperature of approximately 1000° C. In this thermal oxidation process, as the initial stage of the oxidation is performed at a comparatively low temperature, the scattering of impurities within the p-type base layer region 16 and $n^+$-type source region 4 to the outside of the wafer 21 during the thermal oxidation process can be controlled. The film quality and thickness uniformity of the gate oxide film 8, the interface interfacial sequence density of the interface of the channel 5 and the carrier mobility are as high as those of the conventional DMOS.

Now, as illustrated in FIG. 19, the gate electrode 9 is formed by depositing a polysilicon film on the main surface of the wafer 21 to a thickness of approximately 400 nm and patterning the polysilicon film so as to be separated by a distance of c which is shorter by 2β than the distance b between the two U-grooves 50 adjacent to each other. Then, the gate oxide film 8 is further oxidized (a thick film part is formed) so as to be thicker at the end part of the gate electrode 9. Here, when the length of a part where the gate oxide film 8 is thickened is x as illustrated in FIG. 20, β is set to be longer than x (β>x).

In this manner, the gate oxide film 8 is arranged to be a part λ which is uniform in thickness and thin (a thin film part) in the neighborhood of the semiconductor region 4 and on a surface part 501 of the semiconductor region 4 where the impurity concentration is lower than the impurity concentration of the flat part surface of the semiconductor region 4. In other words, the gate oxide film 8 is composed of the thin film part λ uniformly and thinly formed on the side of the U-groove 50 and the thick film part thickly formed in comparison with the thin film part and the gate electrode 9 formed on the gate oxide film 8 from the bottom part of the U-groove 50 to the top of the thick film part.

The processes illustrated in FIGS. 9 through 19 are the most important stages of the manufacturing process according to this embodiment, in which the n-type base layer 16, the $n^+$-type source layer 4 and the channel 5 are formed by using the LOCOS oxide film 65 as a mask for self-alignment type double diffusion, then the LOCOS oxide film 65 is removed and then the gate oxide film 8 (equivalent to a gate insulating film) and the gate electrode 9 (equivalent to a gate electrode) are formed (equivalent to a gate electrode formation process).

Next, as illustrated in FIG. 21, boron ions are implanted through an oxide film 67 by using a patterned resist film 68 as a mask to form the $p^+$-type base contact layer 17.

Following the above, as illustrated in FIG. 22, the $p^+$-type base contact layer 17 is formed to a thickness of approximately 0.5 μm by thermal diffusion.

Then, as illustrated in FIG. 1(b), the interlayer insulating film 18 is formed with a BPSG on the main surface of the wafer 21 and contact holes are made in parts of the interlayer insulating film 18 to expose the $p^+$-type base contact layer 17 and the $n^+$-type source layer 4. Furthermore, the source electrode 19 is formed with an aluminum film and ohmic contact is made between the source electrode 19 (equivalent to a source electrode) and the $p^+$-type base contact layer 17 and $n^+$-type source layer 4 through the contact hole. Subsequently, a passivation film (not illustrated) is formed with silicon nitride, etc. for protecting the aluminum film by the CVD (chemical vapor deposition) technique or the like. On the back surface of the wafer 21 is formed the drain electrode 20 (Equivalent to a drain electrode) with three layers of a Ti film, a Ni film and a Au film, an ohmic contact is made between the drain electrode 20 and the $n^+$-type semiconductor substrate 1 (equivalent to a source and drain electrode formation process and an electrode formation process).

According to this embodiment of the present invention constructed as described above, a specified region of the surface of the semiconductor layer having a low impurity concentration is removed by the chemical dry etching method prior to the selective oxidation. The chemical dry etching method which is one of the dry etching methods is high in process controllability, uniform in etching within the wafer surface and high in reproducibility. The chemical dry etching gives comparatively less damage to the etching surface compared with other dry etching methods. After this chemical dry etching, the surface of the groove 64 (the first groove) is oxidized. In this oxidation process, according to the surface condition of the groove 64 from which the oxidation is started, the condition of the boundary surface with the oxide film of the resultant $n^-$-type epitaxial layer 2 (the semiconductor layer) varies. That is, even if the surface etched by a physical etching technique such as RIE is oxidized, the oxidation advances without removing lattice defects and the lattice defects remain on the surface of the resultant $n^-$-type epitaxial layer 2 (the semiconductor layer). However, in the present invention, by applying the chemical dry etching to the surface of the groove 64, the groove 64 with a few lattice defects can be formed and oxidation of the surface of the resultant first groove can be uniform from the start of the oxidation and therefore the surface of the U-groove 50 can have a few lattice defects. Furthermore, as the surface of this U-groove 50 is used for the channel region, a low ON-resistance can be obtained. Moreover, as two processes of the chemical dry etching and the oxidation are applied to the formation of the U-groove 50 for the channel region, when the U-groove 50 is desired to be formed to a specified width, all that is required is to control the width to be oxidized. Therefore, the shape of the second groove can exactly be controlled.

Furthermore, according to this embodiment, as the chemical dry etching process is isotropic according to the present invention, the groove 64 has no corner part and consequently the U-groove 50 formed by oxidation has no corner part, whereby the withstand voltage between the drain layer and the source layer can be improved. Moreover, an angle in the neighborhood of the surface of the n⁻-type epitaxial layer 2 of the groove 64 is nearly 90° and the angle of inclination of the side surface of the U-groove 50 formed after the selective oxidation can be made sharp, whereby the cell size can be reduced and a low ON-state voltage can be obtained.

On the other hand, as the chemical dry etching uses gas containing carbon tetrafluoride and oxygen, the process can exactly be performed with a high reproducibility by controlling the ratio of the carbon tetrafluoride to the oxygen.

In addition to the above, according to this embodiment, as there is no substantial cathode drop on the upper part of the semiconductor substrate 1 or the n⁻-type epitaxial layer 2 during the chemical dry etching process, there is no possibility that the ionized gas collides against the surface of the semiconductor layer at such a speed that the collision gives defects to the surface of the semiconductor. Accordingly, the surface of the formed groove 64 has a few defects.

Besides the above, according to this embodiment, as the oxidation process is a selective oxidation process for selectively oxidizing the groove 64, the depth of the groove 64 can be increased. Also, as the mask used in the chemical dry etching process can be used as it is in the selective oxidation process, there is no need to form a new mask or perform a mask alignment.

Furthermore, the process for exposing the channel region by removing the oxide film after the oxidation process is performed while terminating the dangling bond on the surface of the n⁻-type epitaxial layer 2 with hydrogen within an aqueous solution. As a result of this process, the highly reactive dangling bond reacts to the hydrogen before reacting to the contaminant into a stable state, whereby the reaction of the contaminant to the n⁻-type epitaxial layer 2 can be prevented. Subsequently, when the dangling bond is exposed to the oxygen, a more stable oxide film can be formed, whereby the surface of the U-groove 50 can be protected and the following contamination of the channel region can be prevented, whereby a high channel mobility can be obtained and a low ON-state voltage can be realized.

Furthermore, the removal of the oxide film is performed within an aqueous solution including hydrofluoric acid, the selection ratio of the oxide film to be removed and the n⁻-type epitaxial layer 2 not to be removed can be set to be a very large and the oxide film can be removed without damaging the surface of the n⁻-type epitaxial layer 2.

Still furthermore, as the base layer and the source layer are formed in self-alignment with the selective oxide film, there is no alignment, whereby the base layer and the source layer can be formed in an exact position and consequently the area of the semiconductor device can be reduced.

Moreover, because light is not irradiated onto the surface of the oxide film during the oxide film removal process, there is no light irradiated onto the semiconductor layer to be a channel region through the oxide film. Accordingly, as the electric potential of the n⁻-type source layer 4 is almost equal to the electric potential of the p-type base layer 16 both in the neighborhood of the channel region, the development of etching from a limited part can be prevented and a uniform etching is possible. As a result, a flat channel region can be obtained and a high mobility can be realized.

On the other hand, as the index of plane of the side surface of the U-groove 50 formed by removing the selective oxide film is (111), the silicon atoms of the side surface of the second groove can be terminated with a single piece of hydrogen and the side surface can be flat in terms of atomic order, whereby a high channel mobility can be obtained. Furthermore, as the oxide film removal process is performed within an aqueous solution of pH4 or more, the possibility of terminating the silicon atoms of the side surface of the U-groove 50 with a single piece of hydrogen can become higher and the (111) surface flat in terms of atomic order can be obtained, whereby a high channel mobility can be obtained.

In short, in the above embodiment, the surface of the silicon substrate 1 with an index of plane of (100) is used, the conditions of etching and selective oxidation are selected by using an oxidation resistant mask patterned at a roughly right angle or in roughly parallel to an direction of <011> on the surface of the silicon substrate 1, an angle of the side surface of the U-groove 50 to the surface of the substrate 1 is exactly be controlled and thereby the side surface of the U-groove 50 is made to be an equivalent crystal surface with an index of plane of (ABB). As a result, the side surface of the U-groove 50 can be made to be crystal surface, the channel mobility can be made high and the ON-resistance can be reduced. Here, when the angle θ of the side surface of the U-groove 50 to the surface of the substrate 1 is controlled to be 54.7°, a crystal surface with a high mobility and an index of plane of (111) as per this embodiment can be obtained, whereby the ON-resistance can be reduced.

Also in this embodiment, as illustrated in FIG. 20, the gate oxide film 8 is the thin film part λ with a uniform in thickness and thin film at the part 501 in the neighborhood of the semiconductor region 4 with a low surface impurity concentration. Therefore, when a voltage is applied to between the gate electrode 9 and the source electrode 19, as the electric field is not mitigated, electrons are accumulated on the surface thereof, the surface electron density increases and the resistance of the source layer 4 decreases, whereby the ON-resistance can be reduced.

As the gate electrode end part is the thick film part x of the gate oxide film 8, the electric field is mitigated and the life time of the gate oxide film 8 can be elongated.

In the above description, only the case where the gate oxide film 8 is uniform in thickness and thin at the part 501 where the surface impurity concentration is low is treated. Also in a care where the film thickness of the gate oxide film 8 is not uniform, as the gate electrode 9 is formed through the gate oxide film 8, electrons are accumulated on the surface thereof and the surface electron density increases, whereby the ON-resistance can be reduced.

Figure 23:
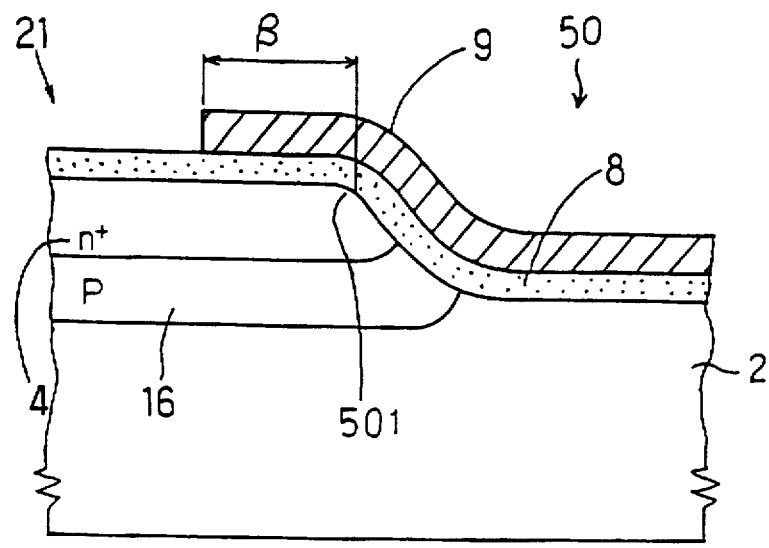
FIG. 23 is a cross-sectional view illustrating the manufacturing process of the important part of the vertical type power MOSFET of another embodiment according to the present invention.

Furthermore, as illustrated in FIG. 23, it may be so constructed that the gate electrode 9 is lengthened by β on the gate oxide film on the surface part 501 of the semiconductor region 4 in the neighborhood of the U-groove 50 of the semiconductor region 21 where the impurity concentration is higher compared with the impurity concentration of the surface of the flat part of the semiconductor region 4.

Now, the effect of the above arrangement as illustrated in FIG. 23 will be described.

When a voltage is applied to between the gate electrode 9 and the source electrode 19, electrons are accumulated on the part 501 in the neighborhood of the U-groove 50 on the flat part of the surface of the semiconductor region 4 by the gate electrode 9 formed with an elongation of β on the upper part of this low impurity concentration part and the surface electron density increases. As a result, the resistance of the source layer 4 decreases and the ON-resistance can be reduced.

As described above, it has been considered that by performing the LOCOS oxidation after the physical etching such as RIE or the wet etching, the lattice defects introduced in the initial groove (the first groove, i.e., the groove 64) formation process could be removed by performing the LOCOS oxidation and removing the LOCOS oxide film. However, as a result of actual experiments by the inventors, it was confirmed that the lattice defects introduced in the initial groove formation process could not be removed and remain on the surface of the channel region and this resulted in the cause of the leak current between the drain electrode and the source electrode and findings that the initial groove formation process had to be free from lattice defects. However, the chemical dry etching known as a process without defect as in wet etching is slower in etching speed than the wet etching and is isotropic the wet etching but causes side etch and therefore is not suitable to micronization. Accordingly, from the viewpoint of the current technique of reducing the channel resistance and the ON-resistance by shortening the channel length by micronization, the chemical dry etching has been considered to be not suitable to the groove formation process. However, in the initial groove (the first groove, i.e., the groove 64) formation process by performing the LOCOS oxidation after etching, although there is a little difference in the time required for the etching between the chemical wet etching and the chemical dry etching, the lattice defects on the surface of the channel region which is ultimately obtained are a few and the plane of any index can be formed exactly.

Although only one embodiment of the present invention has been described herein, it may be apparent that the present invention may be embodied in many other forms without departing from the spirit or the scope of the invention. For example, in the above embodiment, the silicon surface is protected by applying a natural oxide film by means of natural oxidation after removing the LOCOS oxide film within the aqueous solution containing hydrofluoric acid. This process, however, may be performed at a high temperature such as 900° C. A resist mask may be used for the formation of the n-type source layer and the p-type source layer after removing the LOCOS oxide film. Furthermore, the plane orientation of the silicon substrate and the patterning shape may be selected so that the index of plane of side surface of the U-groove can be (110) or (100).

Now, a manufacturing method for a semiconductor device which makes the plane orientation of the side surface of the groove to be a (110) plane will be described only as to those parts which are different from the first embodiment.

Figure 24:
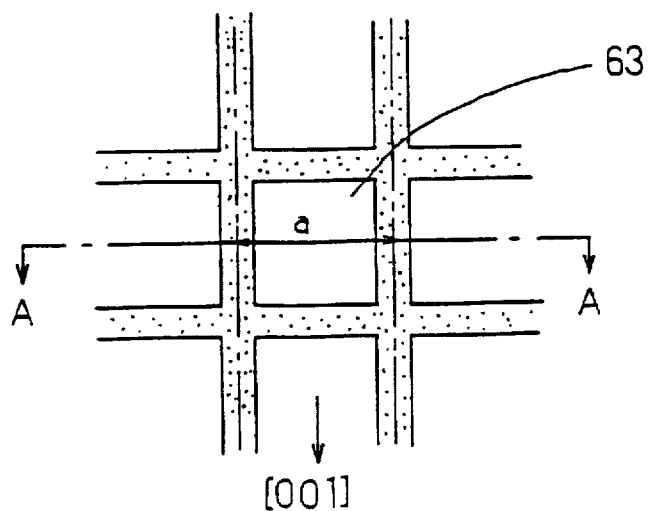
FIG. 24 is a plane view illustrating the manufacturing process of the important part of the vertical type power MOSFET of the second embodiment according to the present invention.
Figure 25A:
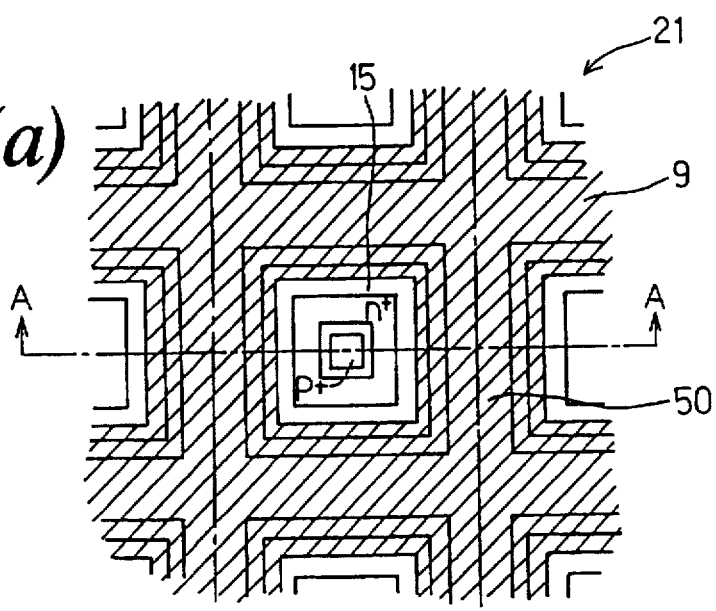
FIG. 25(a) is a plane view illustrating a part of a conventional power MOSFET.
Figure 25B:
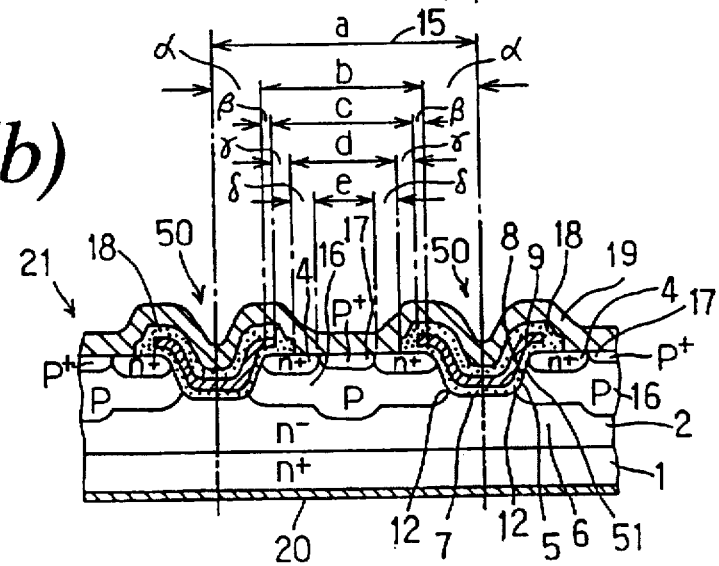
FIG. 25(b) is a cross-sectional view taken along line A—A of FIG. 25(a)
Figure 26:
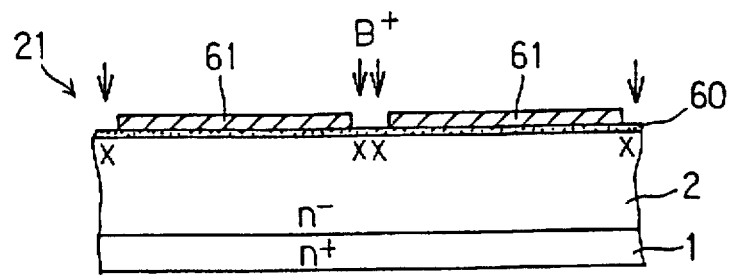
FIG. 26 is a cross-sectional view illustrating the manufacturing process of an important part of the conventional vertical type power MOSFET.
Figure 27:
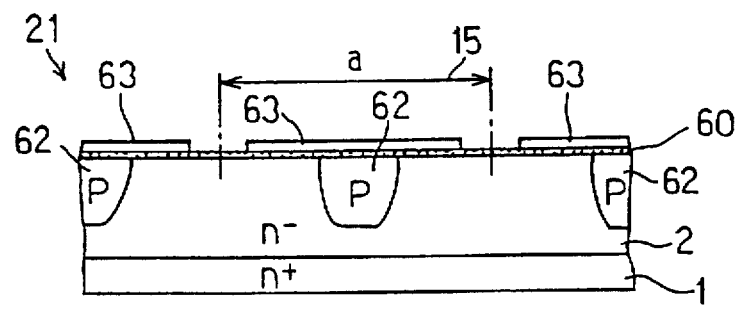
FIG. 27 is a cross-sectional view illustrating the manufacturing process of the important part of the conventional vertical type power MOSFET.
Figure 28:
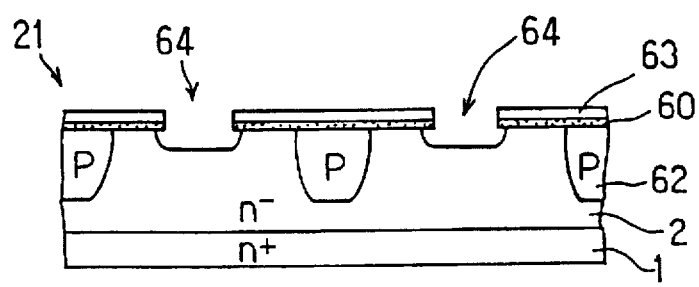
FIG. 28 is a cross-sectional view illustrating the manufacturing process of the important part of the conventional vertical type power MOSFET.
Figure 29:
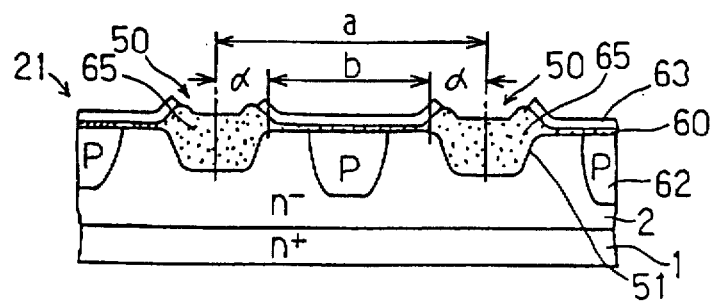
FIG. 29 is a cross-sectional view illustrating the manufacturing process of the important part of the conventional vertical type power MOSFET.
Figure 30:
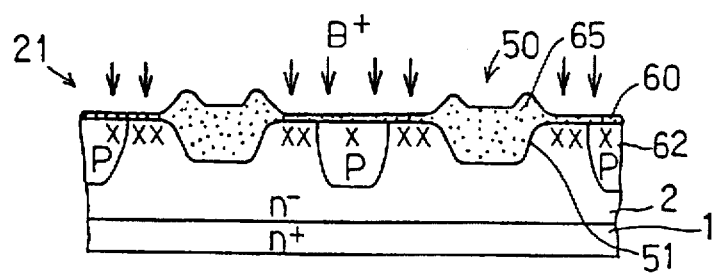
FIG. 30 is a cross-sectional view illustrating the manufacturing process of the important part of the conventional vertical type power MOSFET.
Figure 31:
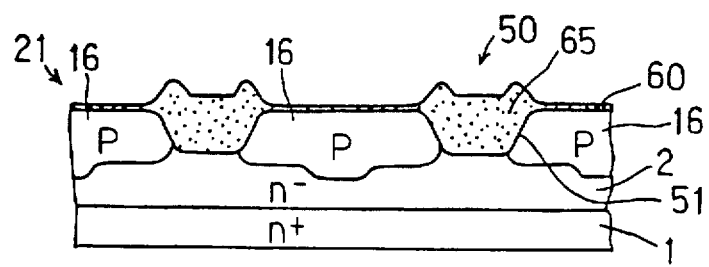
FIG. 31 is a cross-sectional view illustrating the manufacturing process of the important part of the conventional vertical type power MOSFET.
Figure 32:
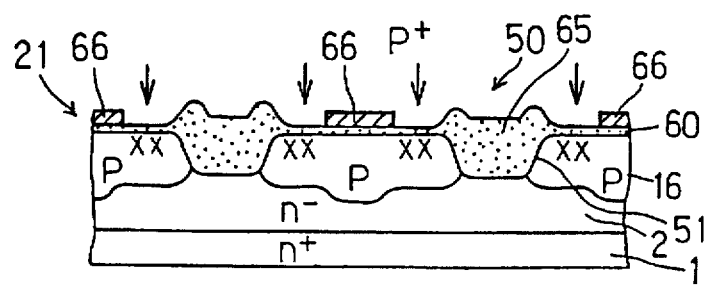
FIG. 32 is a cross-sectional view illustrating the manufacturing process of the important part of the conventional vertical type power MOSFET.
Figure 33:
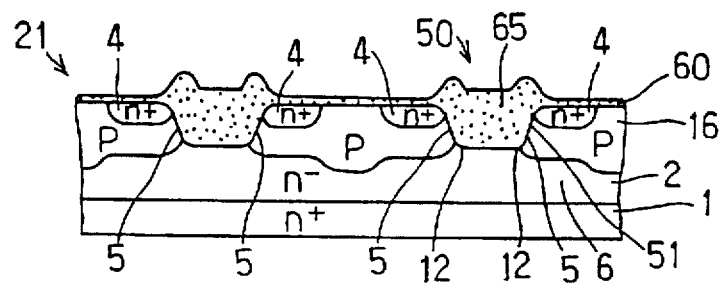
FIG. 33 is a cross-sectional view illustrating the manufacturing process of the important part of the conventional vertical type power MOSFET.
Figure 34:
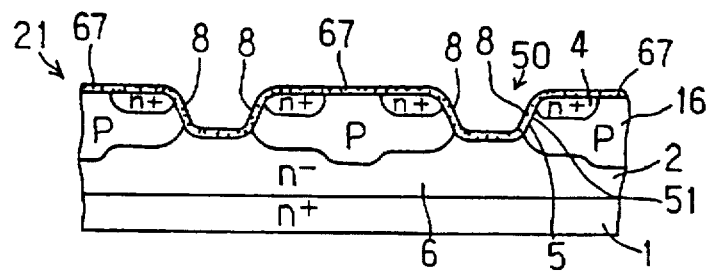
FIG. 34 is a cross-sectional view illustrating the manufacturing process of the important part of the conventional vertical type power MOSFET.
Figure 35:
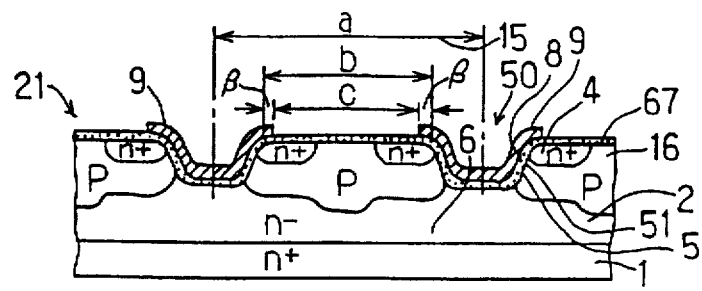
FIG. 35 is a cross-sectional view illustrating the manufacturing process of the important part of the conventional vertical type power MOSFET.
Figure 36:
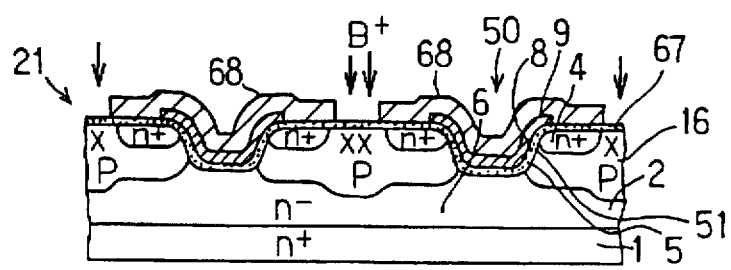
FIG. 36 is a cross-sectional view illustrating the manufacturing process of the important part of the conventional vertical type power MOSFET.
Figure 37:
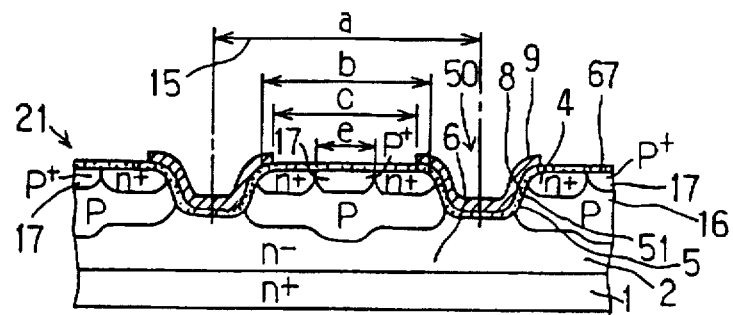
FIG. 37 is a cross-sectional view illustrating the manufacturing process of the important part of the conventional vertical type power MOSFET.

In the silicon nitride film patterning process illustrated in FIG. 6, the silicon nitride film 63 is patterned to be perpendicular and parallel to an orientation of <001> and an open pattern is formed with opening at a pitch a as illustrated in FIG. 24.

By using this silicon nitride film 63 as a mask, the chemical dry etching and the LOCOS oxidation are performed. In this process, the conditions of the chemical dry etching and LOCOS oxidation are selected by controlling an angle θ which is an angle of the side surface of the U-groove 50 to the surface of the substrate 1 illustrated in 8 so that the index of plane of the channel formation part on the side surface of the U-groove 50 can be approximated to (110).

In the oxidation process illustrated in FIG. 15, it is advisable to perform the above process by forming the oxide film on the surface side 5 of the U-groove 50 of the p-type base layer 16 on which a channel is to be formed until the (110) plane can be formed.

The effect of the second embodiment will be described. By making the side surface of the U-groove 50 to be a crystal surface with the (110) plane having a high channel mobility, the channel mobility can be increased and thereby the ON-resistance can be reduced.

Although description has been given only to a case where the side surface of the U-groove 50 is made to be a crystal surface with the (110) plane, it is acceptable that the side surface of the U-groove 50 is made to be a crystal surface with the (AB0), wherein A and B are integers, to increase the channel mobility and decrease the ON-resistance.

That is, when the silicon substrate 1 with an index of plane of (100) is used, the conditions of the etching and selective oxidation is selected by using an oxidation resistant mask patterned at a roughly right angle or roughly parallel to an orientation of <001> of the surface of the silicon substrate 1 and an angle θ of the side surface of the U-groove 50 to the surface of the silicon substrate 1 is controlled, the side surface of the U-groove 50 can be made to be an equivalent crystal surface having the index of plane of (AB0), wherein A and B are integers. As a result, the side surface can be made to be a crystal surface and the channel mobility can be increased, whereby the ON-resistance can be reduced. Particularly, in the second embodiment, by controlling an angle θ of the side surface of the U-groove 50 to the surface of the silicon substrate 1 to be 45.0°, the side surface of the U-groove 50 can be made to be an equivalent crystal surface with an index of plane of (110), whereby the ON-resistance can be reduced.

In the above description, the silicon substrate 1 with an index of plane of (100) is used and the oxide resistant mask patterned at a right angle and parallel to an orientation <011> or <001> of the surface of the silicon substrate 1. However, even if this condition is deviated from the above, as long as the channel mobility on the four planes of the side surface of the U-groove 50 can be improved and the an interfacial level can be formed with a high symmetry, this case can be included in the present invention.

Also, in the above embodiment, the lattice-like pattern is used for patterning at a right angle and parallel to an orientation of <011> or <001>. The present invention, however, should not be limited to the lattice-like pattern but a stripe-like pattern may also be used and the patterning may be at either a right angle or parallel to an orientation of <011> or <001>.

In the various embodiments, only the application of the present invention to a vertical type power MOSFET has been described. The present invention, however, may also be applied to a power MOSIC with an incorporation of a vertical type power MOSFET. Furthermore, in the present embodiments, description has been given to a vertical type power MOSFET using an $n^+$-type semiconductor substrate as a semiconductor substrate, but the present invention may also be applied to a gate construction of an IGBT (insulating gate type bipolar transistor) using a $p^+$-type semiconductor substrate.

In addition, the chemical dry etching process may be performed with a gas system which include one or more than one of $CCl_4$, $Cl_2$, $SF_6$, $CFCl_3$, $CF_2Cl_2$, $CF_3Cl$, $CHF_3$, $C_2ClF_5$, $F_2$, $NF_3$ and $BCl_3$, whereby the efficiency of this etching process can be increased.

Moreover, in the current embodiments, the chemical dry etching is performed without applying a voltage to the semiconductor substrate, but the chemical dry etching may also be performed within the ionized gas atmosphere with a cathode drop on the upper part of the semiconductor layer of less than 10V in absolute value. As a result of this chemical dry etching, it is not possible that the ionized gas collides at a speed that may cause defects to the surface of the semiconductor layer and the surface of the formed groove 64 can be a surface with a few defects.

Furthermore, in the current embodiments, description has been given only to the n channel type, it is needless to say that the p-channel type can have the same effect as the n channel type.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a semiconductor device comprising steps of:

providing a semiconductor layer disposed on a semiconductor substrate;

forming a mask having an opening part within a specified region on a main surface of the semiconductor layer;

generating plasma within a plasma generation chamber containing an etching gas to form a chemically active etching gas, the plasma generation chamber being physically separated from a reaction chamber in which the semiconductor substrate and the semiconductor layer are disposed;

introducing the chemically active etching gas into the reaction chamber by transporting the chemically active gas from the plasma generation chamber to the reaction chamber via a passageway between the plasma generation chamber and the reaction chamber, the chemically active gas performing a chemical dry etching process to define a groove in the semiconductor layer, the groove including:

an inlet part wider than the opening part of the mask,
   a bottom surface generally parallel to the main surface, and
   a side surface connecting the inlet part and the bottom surface;

forming an oxide film to a specified thickness on the bottom surface and the side surface of the groove by oxidizing a region of the semiconductor layer including the groove;

performing an impurity introduction process comprising the steps of:

forming a base layer of a second conductivity type within the semiconductor layer by introducing impurities of the second conductivity type, from the main surface including the surface of the semiconductor layer adjacent to the oxide film, forming a source layer of the first conductivity type within the base layer by introducing impurities of the first conductivity type from the main surface, and forming a channel region at a surface of a side wall of the base layer concurrently with the step of forming the source layer;

performing a wet etching process to remove the oxide film; and performing an electrode formation process including steps of:

forming a gate electrode at least on a surface of the groove between the source layer and the semiconductor layer with a gate insulating film interposed therebetween, forming a source electrode which contacts the source layer and the base layer electrically, and forming a drain electrode which contacts the semiconductor substrate electrically.

2. The method of manufacturing a semiconductor device according to claim 1, wherein:

the chemical dry etching process is an isotropic etching process.

3. The method of manufacturing a semiconductor device according to claim 2, wherein the step of dry chemical etching the semiconductor layer is performed within the reaction chamber containing the chemically active etching gas comprising carbon tetrafluoride and oxygen.

4. The method of manufacturing a semiconductor device according to claim 3, wherein:

the chemical dry etching process is performed within an ionized gas atmosphere with no substantial cathode drop on an upper part of the semiconductor layer.

5. The method of manufacturing a semiconductor device according to claim 3, wherein:

the chemical dry etching process is performed within the ionized gas atmosphere with a cathode drop of less than 10V in absolute value on the upper part of the semiconductor layer.

6. The method of manufacturing a semiconductor device according to claim 3, wherein:

the oxidation process comprises a selective oxidation process to form a selective oxide film to the specified thickness by selectively oxidizing the region of the semiconductor layer including the groove; and the wet etching process to remove the oxide film is a selective oxide film removal process which removes the selective oxide film.

7. The method of manufacturing a semiconductor device according to claim 6, wherein:

the selective oxidation process selectively oxidizes the groove by using the mask formed in the mask formation process.

8. The method of manufacturing a semiconductor device according to claim 6, wherein:

the impurity introduction process forms the base layer at end portions of the groove which expose the side surface of the groove, by diffusing the impurities of the second conductivity type from the main surface in self-alignment with the selective oxide film, and forms the source layer by diffusing the impurities of the first conductivity type from the main surface into the base layer in self-alignment with the selective oxide film.

9. The method of manufacturing a semiconductor device according to claim 8, wherein the oxide film removal process comprises:

the step of removing the oxide film is performed under a condition that light is not irradiated onto at least a surface of the oxide film.

10. The method of manufacturing a semiconductor device according to claim 3, wherein:

the step of removing the oxide film includes steps of:
    terminating a surface of the oxide film with hydrogen within an aqueous solution, and
    forming a protective oxide film on a surface of the groove by oxidizing the surface of the groove terminated with the hydrogen within a gas atmosphere containing oxygen.

11. The method of manufacturing a semiconductor device according to claim wherein:

the step of removing the oxide film terminates a dangling bond generated on the surface of the oxide film within an aqueous solution containing hydrofluoric acid.

12. The method of manufacturing a semiconductor device according to claim 3, wherein the step of forming the gate electrode includes steps of:

oxidizing an inside wall of the groove; and forming a gate electrode on the gate oxide film.

13. The method of manufacturing a semiconductor device according to claim 3, wherein:

the step of removing the oxide film is performed under a condition that light is not irradiated onto at least a surface of the oxide film.

14. The method of manufacturing a semiconductor device according to claim 3, wherein:

the semiconductor layer comprises silicon; and the step of removing the oxide film comprises a process for removing the oxide film so that an index of plane of a channel formation part on the side surface of the groove obtained by removing the oxide film is one of (110) and (100).

15. The method of manufacturing a semiconductor device according to claim 3, wherein:

the semiconductor layer comprises silicon; and the step of removing the oxide film comprises a process for removing the oxide film so that an index of plane of the side surface of the groove obtained by removing the oxide film is (111).

16. The method of manufacturing a semiconductor device according to claim 15, wherein:

the step of removing the oxide film is performed within an aqueous solution having a pH of 4 or more.

17. The method of manufacturing a semiconductor device according to claim 2, wherein:

the chemical dry etching process is performed within an ionized gas atmosphere with no substantial cathode drop on an upper part of the semiconductor layer.

18. The method of manufacturing a semiconductor device according to claim 2, wherein:

the oxidation process comprises a selective oxidation process to form a selective oxide film to the specified thickness by selectively oxidizing the region of the semiconductor layer including the groove; and the wet etching process to remove the oxide film is a selective oxide film removal process which removes the selective oxide film.

19. The method of manufacturing a semiconductor device according to claim 18, wherein:

the selective oxidation process selectively oxidizes the groove by using the mask formed in the mask formation process.

20. The method of manufacturing a semiconductor device according to claim 19, wherein:

the selective oxidation process forms the selective oxide film on the bottom surface and the side surface of the groove and between the mask and the semiconductor layer to the specified thickness.

21. The method of manufacturing a semiconductor device according to claim 18, wherein:

the selective oxidation process forms the selective oxide film on the bottom surface and the side surface of the groove and between the mask and the semiconductor layer to the specified thickness.

22. The method of manufacturing a semiconductor device according to claim 2, wherein:

the step of removing the oxide film includes steps of:
terminating a surface of the oxide film with hydrogen within an aqueous solution, and
forming a protective oxide film on a surface of the groove by oxidizing the surface of the groove terminated with the hydrogen within a gas atmosphere containing oxygen.

23. The method of manufacturing a semiconductor device according to claim 1, wherein:

the chemical dry etching process is performed with a gas system which includes at least one gas selected from a group consisting of $CCl_4$, $Cl_2$, $SF_6$, $CFCl_3$, $CF_2Cl_2$, $CF_3Cl$, $CHF_3$, $C_2ClF_5$, $F_2$, $NF_3$ and $BCl_3$.

24. The method of manufacturing a semiconductor device according to claim 23, wherein:

the chemical dry etching process is performed within an ionized gas atmosphere with no substantial cathode drop on an upper part of the semiconductor layer.

25. The method of manufacturing a semiconductor device according to claim 1, wherein:

the chemical dry etching process is performed within an ionized gas atmosphere with no substantial cathode drop on an upper part of the semiconductor layer.

26. The method of manufacturing a semiconductor device according to claim 25, wherein:

the oxidation process comprises a selective oxidation process to form a selective oxide film to the specified thickness by selectively oxidizing the region of the semiconductor layer including the groove; and the wet etching process to remove the oxide film is a selective oxide film removal process which removes the selective oxide film.

27. The method of manufacturing a semiconductor device according to claim 26, wherein:

the selective oxidation process selectively oxidizes the groove by using the mask formed in the mask formation process.

28. The method of manufacturing a semiconductor device according to claim 25, wherein:

the step of removing the oxide film includes steps of:
terminating a surface of the oxide film with hydrogen within an aqueous solution, and
forming a protective oxide film on a surface of the groove by oxidizing the surface of the groove terminated with the hydrogen within a gas atmosphere containing oxygen.

29. The method of manufacturing a semiconductor device according to claim 25, wherein the step of forming the gate electrode includes steps of:

oxidizing an inside wall of the groove; and forming a gate electrode on the gate oxide film.

30. The method of manufacturing a semiconductor device according to claim 25, wherein the oxide film removal process comprises:

the step of removing the oxide film is performed under a condition that light is not irradiated onto at least a surface of the oxide film.

31. The method of manufacturing a semiconductor device according to claim 1, wherein:

the chemical dry etching process is performed within the ionized gas atmosphere with a cathode drop of less than 10V in absolute value on the upper part of the semiconductor layer.

32. The method of manufacturing a semiconductor device according to claim 1, wherein:

the oxidation process comprises a selective oxidation process to form a selective oxide film to the specified thickness by selectively oxidizing the region of the semiconductor layer including the groove; and the wet etching process to remove the oxide film is a selective oxide film removal process which removes the selective oxide film.

33. The method of manufacturing a semiconductor device according to claim 32, wherein:

the selective oxidation process selectively oxidizes the groove by using the mask formed in the mask formation process.

34. The method of manufacturing a semiconductor device according to claim 33, wherein:

the selective oxidation process forms the selective oxide film on the bottom surface and the side surface of the groove and between the mask and the semiconductor layer to the specified thickness.

35. The method of manufacturing a semiconductor device according to claim 33, wherein:

the selective oxidation process forms a first part of the selective oxide film on the bottom surface and side surface of the groove by selectively oxidizing the region including the groove, and forms a second part of the selective oxide film between the mask and the semiconductor layer, the second part of the selective oxide film being formed to become a second part of the specified thickness, which becomes thinner in inverse proportion to a distance from the inlet part of the groove.

36. The method of manufacturing a semiconductor device according to claim 33, wherein:

the impurity introduction process forms the base layer at end portions of the groove which expose the side surfaces of the grooves by diffusing the impurities of the second conductivity type from the main surface in self-alignment with the selective oxide film, and forms the source layer by diffusing the impurities of the first conductivity type from the main surface into the base layer in self-alignment with the selective oxide film.

37. The method of manufacturing a semiconductor device according to claim 32, wherein:

the selective oxidation process forms the selective oxide film on the bottom surface and the side surface of the groove and between the mask and the semiconductor layer to the specified thickness.

38. The method of manufacturing a semiconductor device according to claim 32, wherein:

the selective oxidation process forms a first part of the selective oxide film on the bottom surface and side surface of the groove by selectively oxidizing the region including the groove, and forms a second part of the selective oxide film between the mask and the semiconductor layer, the second part of the selective oxide film being formed to become a second part of the specified thickness, which becomes thinner in inverse proportion to a distance from the inlet part of the groove.

39. The method of manufacturing a semiconductor device according to claim 32, wherein:

the step of removing the oxide film includes steps of:
  terminating a surface of the oxide film with hydrogen within an aqueous solution, and
  forming a protective oxide film on a surface of the groove by oxidizing the surface of the groove terminated with the hydrogen within a gas atmosphere containing oxygen.

40. The method of manufacturing a semiconductor device according to claim 39, wherein:

the impurity introduction process forms the base layer at end portions of the groove which expose the side surfaces of the groove by diffusing the impurities of the second conductivity type from the main surface in self-alignment with the selective oxide film, and forms the source layer by diffusing the impurities of the first conductivity type from the main surface into the base layer in self-alignment with the selective oxide film.

41. The method of manufacturing a semiconductor device according to claim 1, wherein:

the step of removing the oxide film includes steps of:
  terminating a surface of the oxide film with hydrogen within an aqueous solution, and
  forming a protective oxide film on a surface of the groove by oxidizing the surface of the groove terminated with the hydrogen within a gas atmosphere containing oxygen.

42. The method of manufacturing a semiconductor device according to claim 41, wherein:

the step of removing the oxide film terminates a dangling bond generated on the surface of the oxide film within an aqueous solution containing hydrofluoric acid.

43. The method of manufacturing a semiconductor device according to claim 41, wherein the step of forming the gate electrode includes steps of:

oxidizing an inside wall of the groove; and forming a gate electrode on the gate oxide film.

44. The method of manufacturing a semiconductor device according to claim 41, wherein the oxide film removal process comprises:

the step of removing the oxide film is performed under a condition that light is not irradiated onto at least a surface of the oxide film.

45. The method of manufacturing a semiconductor device according to claim 41, wherein:

the semiconductor layer comprises silicon; and the step of removing the oxide film comprises a process for removing the oxide film so that an index of plane of a channel formation part on the side surface of the groove obtained by removing the oxide film is one of (110) and (100).

46. The method of manufacturing a semiconductor device according to claim 41, wherein:

the semiconductor layer comprises silicon; and the step of removing the oxide film comprises a process for removing the oxide film so that an index of plane of the side surface of the groove obtained by removing the oxide film is (111).

47. The method of manufacturing a semiconductor device according to claim 1, wherein:

the step of removing the oxide film is performed under a condition that light is not irradiated onto at least a surface of the oxide film.

48. The method of manufacturing a semiconductor device according to claim 47, wherein:

the semiconductor layer comprises silicon; and the step of removing the oxide film comprises a process for removing the oxide film so that an index of plane of a channel formation part on the side surface of the groove obtained by removing the oxide film is one of (110) and (100).

49. The method of manufacturing a semiconductor device according to claim 47, wherein:

the semiconductor layer comprises silicon; and the step of removing the oxide film comprises a process for removing the oxide film so that an index of plane of the side surface of the groove obtained by removing the oxide film is (111).

50. The method of manufacturing a semiconductor device according to claim 1, wherein:

the semiconductor layer comprises silicon; and the step of removing the oxide film comprises a process for removing the oxide film so that an index of plane of a channel formation part on the side surface of the groove obtained by removing the oxide film is one of (110) and (100).

51. The method of manufacturing a semiconductor device according to claim 1, wherein:

the semiconductor layer comprises silicon; and the step of removing the oxide film comprises a process for removing the oxide film so that an index of plane of the side surface of the groove obtained by removing the oxide film is (111).

52. The method of manufacturing a semiconductor device according to claim 51, wherein:

the step of removing the oxide film is performed within an aqueous solution having a pH of 4 or more.

53. A method of manufacturing a semiconductor device according to claim 1, wherein:

a substance of the semiconductor substrate is silicon.

54. The method of manufacturing a semiconductor device according to claim 1, further comprising the step of introducing impurities of the second conductivity type to a depth deeper than that of the impurities introduced by the step of forming the base layer at a central portion of a region where the base layer is formed, at least before the step of forming the base layer introduces impurities of the second conductivity type into the semiconductor layer, so that the base layer has a deeper part at its center.

55. The method of manufacturing a semiconductor device according to claim 1, wherein the step of forming the gate electrode causes a thickness of the gate insulating film at edges of the gate electrode to be thicker than that of the gate insulating film under a center of the gate electrode.

56. A method of manufacturing a semiconductor device comprising steps of:

performing a selective oxidation process including steps of:

forming a semiconductor layer of a first conductivity type on a semiconductor substrate, the semiconductor layer having an impurity concentration lower than an impurity concentration of the semiconductor substrate, and forming a selective oxide film to a specified depth within a specified region of the semiconductor layer from a first main surface thereof by the steps of:

specifying a region on a surface of the semiconductor layer having the low impurity concentration as the first main surface, and selectively oxidizing the specified region;

performing an impurity introduction process comprising steps of:

diffusing an impurity of a second conductivity type from the first main surface and then an impurity of the first conductivity type into the impurity of the second conductivity type to form a channel near a surface of the semiconductor layer in contact with the selective oxide film, whereby a length of the channel is defined, a base layer of the second conductivity type and a source layer of the first conductivity type are concurrently formed and the semiconductor layer as a drain layer of the first conductivity type are specified;

removing the selective oxide film to form a groove to a specified depth;

performing a gate formation process to form a gate oxide film, including steps of:

oxidizing an inside wall of the groove exposed to a part to be the channel, and forming a gate electrode on the gate oxide film; and performing a source and drain electrode formation process by steps of:

forming a source electrode which is to electrically contact both the source layer and the base layer, and forming a drain electrode which is to electrically contact a second main surface side of the semiconductor substrate;

an index of plane of a surface of the semiconductor substrate being set to (100);

an oxidation resistant mask in the selective oxidation process being patterned at substantially one of a right angle and parallel to an orientation of <011> of the surface on the semiconductor substrate; and an index of plane of a side surface of the groove is set to (111).

57. A method of manufacturing a semiconductor device comprising:

performing a selective oxidation process including steps of:

forming a semiconductor layer of a first conductivity type on a semiconductor substrate, the semiconductor layer having an impurity concentration lower than an impurity concentration of the semiconductor substrate, and forming a selective oxide film to a specified depth within a specified region of the semiconductor layer from a first main surface thereof by steps of:

specifying a region of a surface of the semiconductor layer having the low impurity concentration as the first main surface, and selectively oxidizing the specified region;

performing an impurity introduction process comprising steps of:

diffusing an impurity of a second conductivity type from the first main surface and then an impurity of the first conductivity type into the impurity of the second conductivity type to form a channel near a surface of the semiconductor layer in contact with the selective oxide film, whereby a length of the channel is defined, a base layer of the second conductivity type and a source layer of the first conductivity type are concurrently formed and the semiconductor layer as a drain layer of the first conductivity type are specified;

removing the selective oxide film to form a groove to a specified depth;

performing a gate formation process to form a gate oxide film, including steps of:

oxidizing an inside wall of the groove exposed a part to be the channel, and forming a gate electrode on the gate oxide film; and performing a source and drain electrode formation process by steps of:

forming a source electrode which electrically contacts both the source layer and the base layer, and forming a drain electrode which electrically contacts a second main surface side of the semiconductor substrate;

an index of plane of a surface of the semiconductor substrate being set to (100);

an oxidation resistant mask in the selective oxidation process being patterned at substantially one of a right angle and parallel to an orientation of <001> of the surface on the semiconductor substrate; and an index of plane of a side surface of the groove is set to (110).

\* \* \* \* \*